United States Patent
Harris et al.

(10) Patent No.: US 7,262,946 B2
(45) Date of Patent: Aug. 28, 2007

(54) INTEGRATED ELECTRONIC DISCONNECTING CIRCUITS, METHODS, AND SYSTEMS

(75) Inventors: Richard Harris, Palo Alto, CA (US); Handoko Linewih, Singapore (SG)

(73) Assignee: FulTec Semiconductor, Inc., Mountain View, CA (US)

( * ) Notice: Subject to any disclaimer, the term of this patent is extended or adjusted under 35 U.S.C. 154(b) by 242 days.

(21) Appl. No.: 10/924,763

(22) Filed: Aug. 23, 2004

(65) Prior Publication Data

US 2005/0152080 A1 Jul. 14, 2005

(51) Int. Cl.
*H02H 3/20* (2006.01)

(52) U.S. Cl. .................................. 361/91.1
(58) Field of Classification Search ............... 361/91.1
See application file for complete search history.

(56) References Cited

U.S. PATENT DOCUMENTS

| | | | | |
|---|---|---|---|---|
| 4,366,495 A | * | 12/1982 | Goodman et al. | 257/342 |
| 4,514,747 A | * | 4/1985 | Miyata et al. | 257/135 |
| 4,533,970 A | | 8/1985 | Brown | 361/58 |
| 5,130,262 A | * | 7/1992 | Masquelier et al. | 438/350 |
| 5,168,175 A | * | 12/1992 | Endo | 327/430 |
| 5,742,463 A | * | 4/1998 | Harris | 361/88 |
| 6,020,608 A | * | 2/2000 | Kamashita | 257/270 |
| 6,040,971 A | * | 3/2000 | Martenson et al. | 361/118 |
| 6,266,223 B1 | * | 7/2001 | Curry | 361/119 |
| 6,459,108 B1 | * | 10/2002 | Bartsch et al. | 257/263 |
| 6,515,330 B1 | * | 2/2003 | Hurtz et al. | 257/328 |

FOREIGN PATENT DOCUMENTS

AU 94/00358 1/1995

* cited by examiner

*Primary Examiner*—Stephen W. Jackson
*Assistant Examiner*—S Bauer
(74) *Attorney, Agent, or Firm*—Lumen Intellectual Property Services, Inc.

(57) ABSTRACT

Merged devices for transient blocking. A pass transistor is placed so that its body potential drives the gate of a depletion-mode JFET-type blocking transistor. Thus a transient which appears on an external terminal is very rapidly propagated to shut off the blocking transistor, before large numbers of carriers can be injected. Preferably a shunt device is also used to drop high potentials which may appear at the same time. This connection can be particularly useful in power or data input terminals.

20 Claims, 23 Drawing Sheets

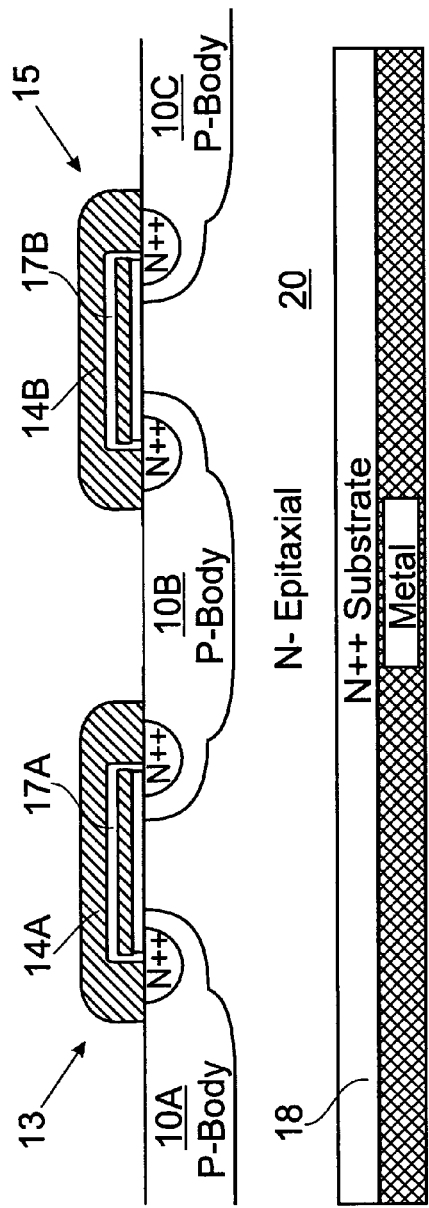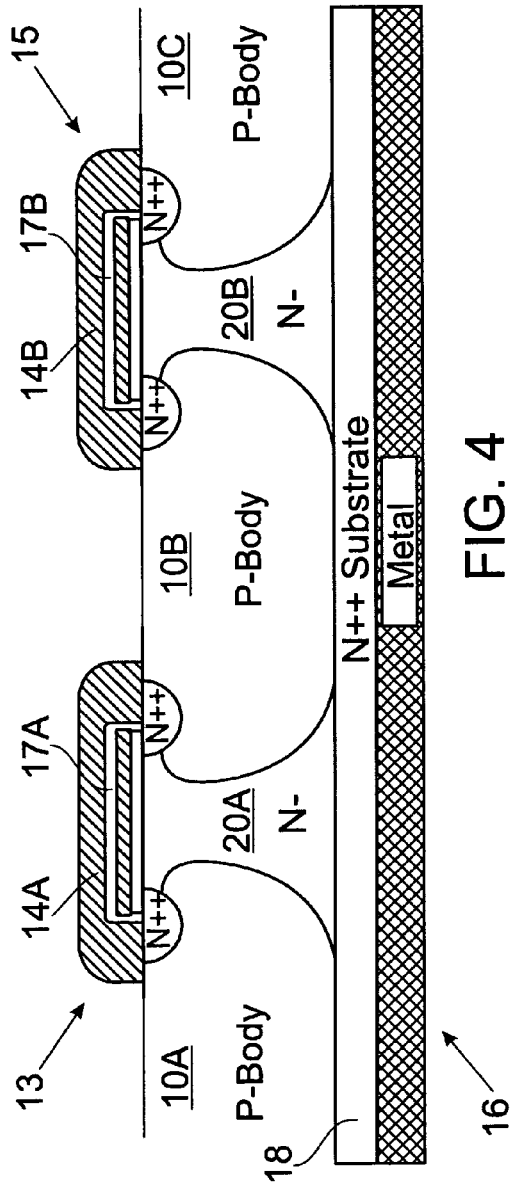
FIG. 3
FIG. 4

US 7,262,946 B2

INTEGRATED ELECTRONIC DISCONNECTING CIRCUITS, METHODS, AND SYSTEMS

CROSS-REFERENCE TO RELATED APPLICATIONS

The present application claims priority from Australian provisional applications 2003904508, filed Aug. 21, 2003, and 2004901192, filed Mar. 9, 2004, both of which are hereby incorporated by reference.

BACKGROUND AND SUMMARY OF THE INVENTION

The present invention relates to a disconnecting circuit, and particularly to a solid-state device for blocking undesirable overvoltages and associated current transients from sensitive electronic circuitry.

In international patent application WO 95/01667, which is hereby incorporated by reference, a series protective circuit is described. The protective circuit includes a number of discrete high voltage field effect transistors (FETs) and is placed in series between a power source and a load to be protected. The protective circuit is configured so that under normal conditions the drain-to-source resistance of the FETs assumes a low resistance state. However, in response to a high voltage transient the protective circuit is configured to very rapidly open-circuit, thereby preventing damaging transmission of transient over-voltages to the load.

It will be realized that implementing the circuit by soldering or otherwise connecting the discrete FETs results in a bulky device, which is less desirable.

One approach to miniaturizing the device would be to fabricate the FETs of the circuit in silicon on the surface of a semiconductor wafer as shown in FIG. 2 (which shows three lateral JFETs). While such an approach is well suited for implementing low voltage integrated circuits, it is not preferred where high power/voltage handling capability is desired. For example, circuits which must control AC motors or other inductive loads may need to operate at specified supply voltage magnitudes of 180V or more.

The present application describes a variety of transient blocking devices which use combined or merged transistor structures to achieve fast turn-off of a blocking transistor which can withstand high voltages. Preferably the blocking transistor is a depletion FET, e.g. a JFET or equivalent, in which the gate potential is driven by the body of a pass transistor.

Various embodiments describe various configurations for the blocking and pass transistors. In some classes of embodiments, the combination of a blocking transistor with two pass transistors is used for bidirectional transient blocking; in other embodiments only one pass transistor is used for unidirectional blocking.

Some embodiments use vertical pass transistors, which is more advantageous for low on-resistance and high blocking voltage; some others use lateral pass transistors, which is more advantageous for integrated embodiments. In such integrated embodiments a single solid structure, e.g. a high-voltage integrated circuit, combines transient blocking units as well as high-voltage circuitry.

Some embodiments use a gap between buried-layer diffusions to define the channel of the blocking transistor, which has the advantage of providing a high-breakdown-voltage device with good process integration capability.

Some embodiments use a gap between surface diffusions to define the channel of the blocking transistor, and place one source/drain terminal in an overlying (e.g. epitaxial) semiconductor layer. This configuration has the advantage of reduced susceptibility to latchup or problems caused by carrier diffusion.

Thus the present invention advantageously provides a solid-state circuit which is suitable for high voltage applications and which may be used to implement a transient protection circuit. Significant advantages of the innovative devices, systems, and methods include:

Rapid interruption of transient currents;
Ability to withstand voltages well above residential power line and subscriber line levels;
Device structure with capability for integration with power and/or smart power circuits;
Systems with very easy design specification;
Systems with reduced requirements for coordination of multiple types of protection devices;
Low on-state resistance;
Physically compact;
Good protection against grounding (earthing) problems, as well as against data or power line glitches;
Fast recovery from current interruption;
Autonomous recovery from current interruption, i.e. without requiring help from any external circuitry; and
Easy retrofit to existing system designs.

Further variations and optional features are described in the detailed description of exemplary embodiments which makes reference to a number of figures as follows.

BRIEF DESCRIPTION OF THE DRAWINGS

Various embodiments of the disclosed innovations are described with reference to the accompanying drawings, which are hereby incorporated by reference, and in which:

FIG. 3 is a cross section through a prior art pair of vertical DMOSFETs.

FIG. 4 is a cross section through another pair of vertical DMOSFETs.

DETAILED DESCRIPTION OF EXEMPLARY EMBODIMENTS

The numerous innovative teachings of the present application will be described with particular reference to the presently preferred embodiment (by way of example, and not of limitation).

Figure 1:
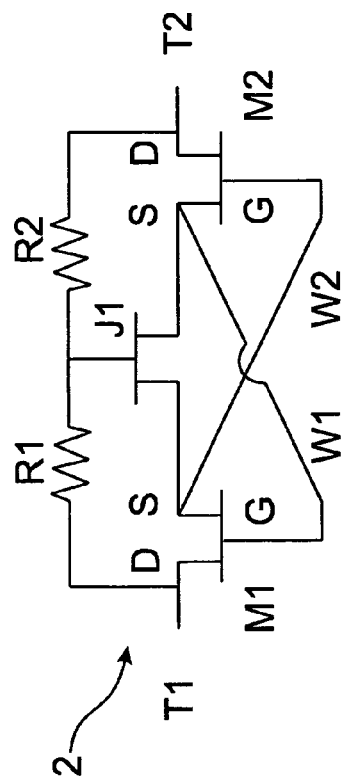
FIG. 1 is a schematic diagram of a transient protection circuit.

FIG. 1 is a circuit schematic of a protective circuit 2 according to an embodiment of international patent application PCT/AU94/00358 (WO 95/01667), which is hereby incorporated in its entirety by reference. The circuit includes two MOSFETs M1 and M2 in series connection with an intermediate JFET J1. Various feedback paths are provided by wires W1 and W2 and resistors R1 and R2.

MOSFETs M1 and M2 are typically fabricated according to a vertical channel design by which the drain and source are placed on opposite surfaces of a semiconductor wafer. An example of such a FET is described in U.S. Pat. No. 4,587,713 to Goodman et al, which is hereby incorporated by reference.

Other vertical channel FET designs are also known. For example, the first commercially available vertical channel FETs were V-groove or VMOSFETs. Since the late 1990's "trench" DMOSFETs, also referred to as "U-groove FETs" or UMOSFETs, have been commercially available.

UMOSFETs have a higher channel density relative to VMOSFETs and DMOSFETs which in turn reduces UMOSFET on-resistance. As will be realized, the present invention is not restricted for use with any particular vertical MOSFET architecture.

Figure 2:
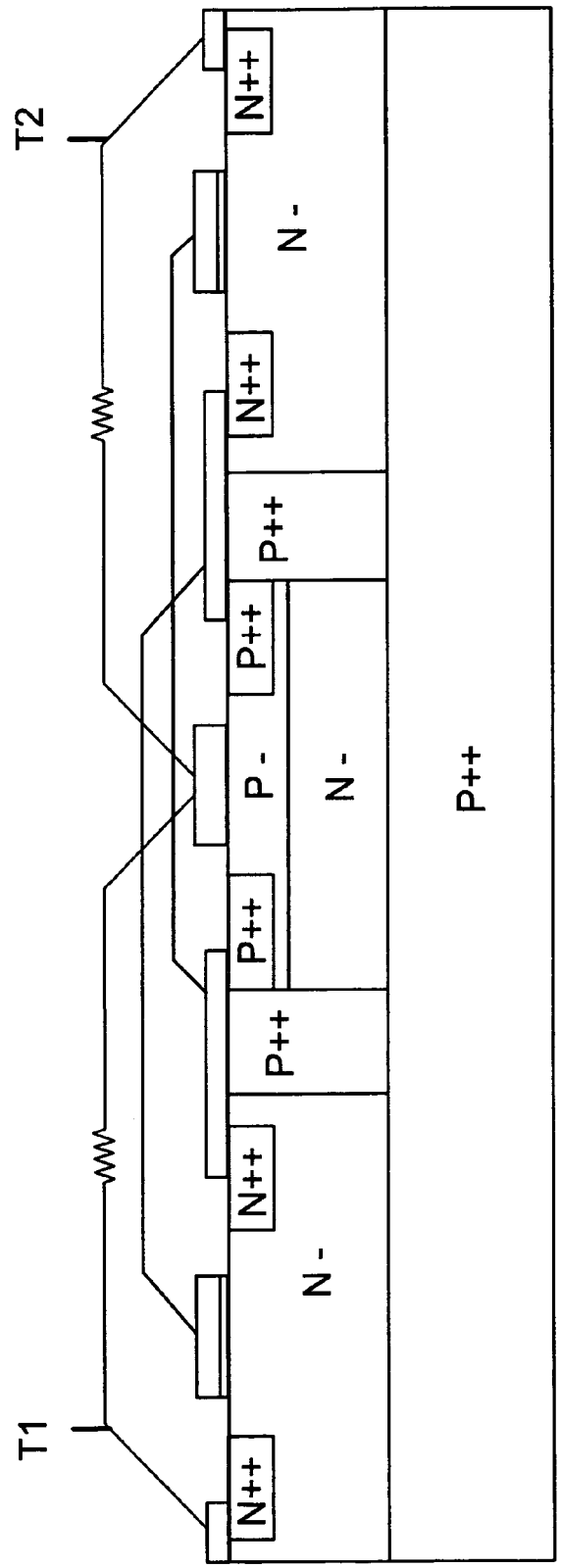
FIG. 2 is a schematic diagram of an integrated circuit implementation of the circuit of FIG. 1 according to prior art design principles.

As previously discussed, one approach to miniaturizing the device would be to fabricate the FETs of the circuit in silicon on the surface of a semiconductor wafer as shown in FIG. 2 (which shows three lateral JFETs). However, that approach is not well suited in applications where high power/voltage handling capability is desired.

Referring now to FIG. 3, there is depicted a cross-section of a typical prior art pair of N-channel DMOSFETs 13 and 15 having P-body regions 10A-10C and N+ source regions in ohmic contact with aluminum source terminals 14A and 14B. The DMOSFETs extend between opposing surfaces of the integrated circuit. The DMOSFETs have a common drain in the form of a metallized contact 16 that covers the underside of N+ substrate 18. N– epitaxial layer 20 provides a channel between source and drain for each of DMOSFETs 13 and 15.

Referring now to FIG. 4, there is depicted a variation to the arrangement of FIG. 3 wherein the P-body layers have been driven so that they extend until they are close to or touch the N+ substrate layer 18. A preferred embodiment of the present invention is based on the observation that the intermediate P-body region 10B may be adapted to provide a useful JFET interposed between MOSFETs 13 and 15.

Figure 5:
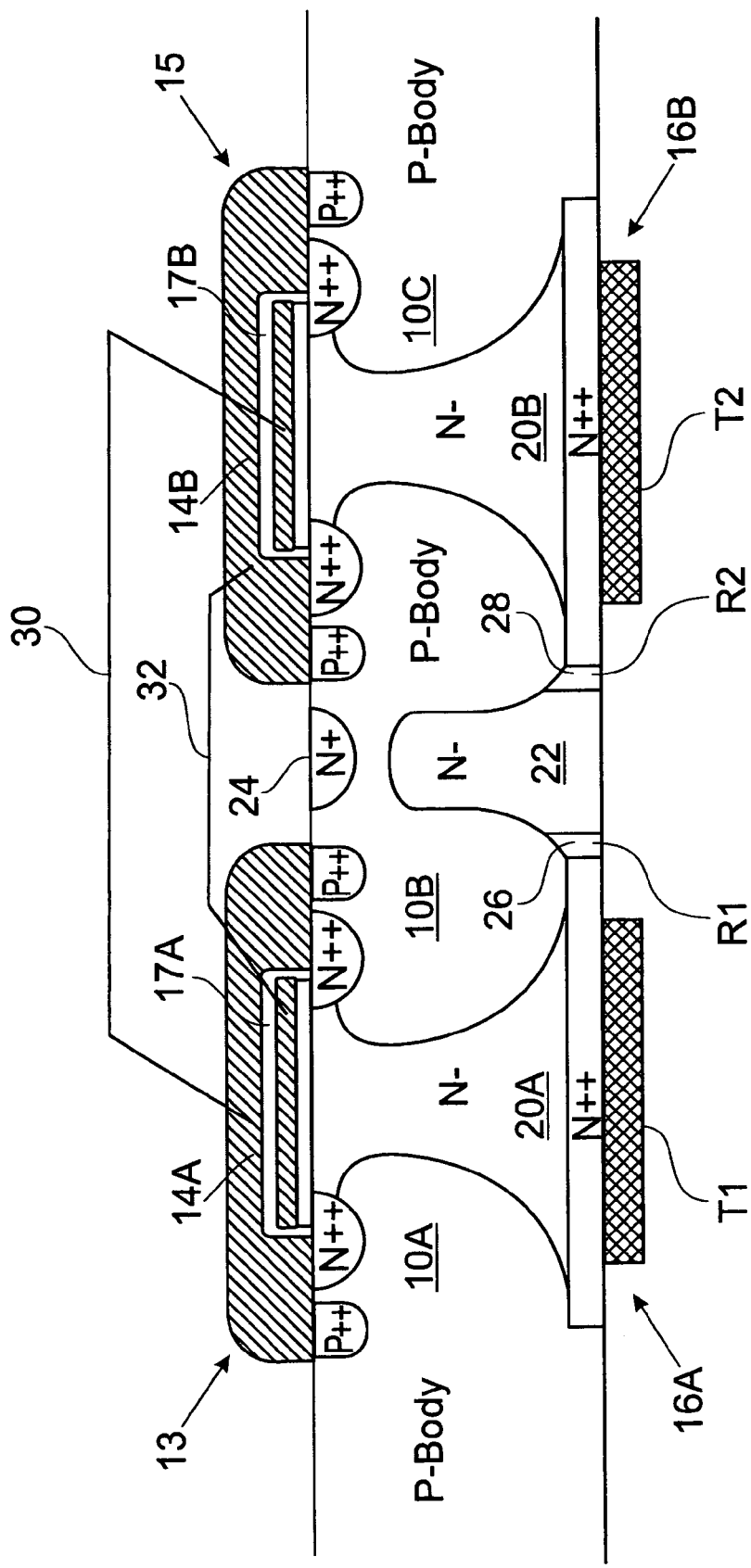
FIG. 5 is a cross section through an integrated circuit according to a first bidirectional embodiment of the present invention.

FIG. 5 shows a preferred embodiment of the present invention wherein the substrate 18 and metal drain contact 16 of FIG. 3 are discontinuous in order to form two distinct drains 16A and 16B. In the intermediate P-body region 10B, an N-region 22 has been formed which is connected to drains 16A and 16B via suitably deposited resistive regions 26 and 28. It will be realized that P-body region 10B forms a channel of a JFET connected between MOSFET 13, corresponding to M1 of FIG. 1, and MOSFET 15, corresponding to M2 of FIG. 1.

The gate of the JFET is provided by N– region 22. Traces, or other conductors, 30 and 32 correspond to wires W1 and W2 in FIG. 1, thereby completing the desired integrated circuit implementation of that circuit.

The horizontally layered N/P regions of FIG. 5 can be manufactured by either starting with N– substrate and doping P regions from both sides of the substrate, through suitably engineered mask layers, to a depth where the P regions meet in the middle. Alternatively, they may also be produced by beginning with P– doped substrate and doping N– regions from both sides so they meet in the middle.

Figure 6:
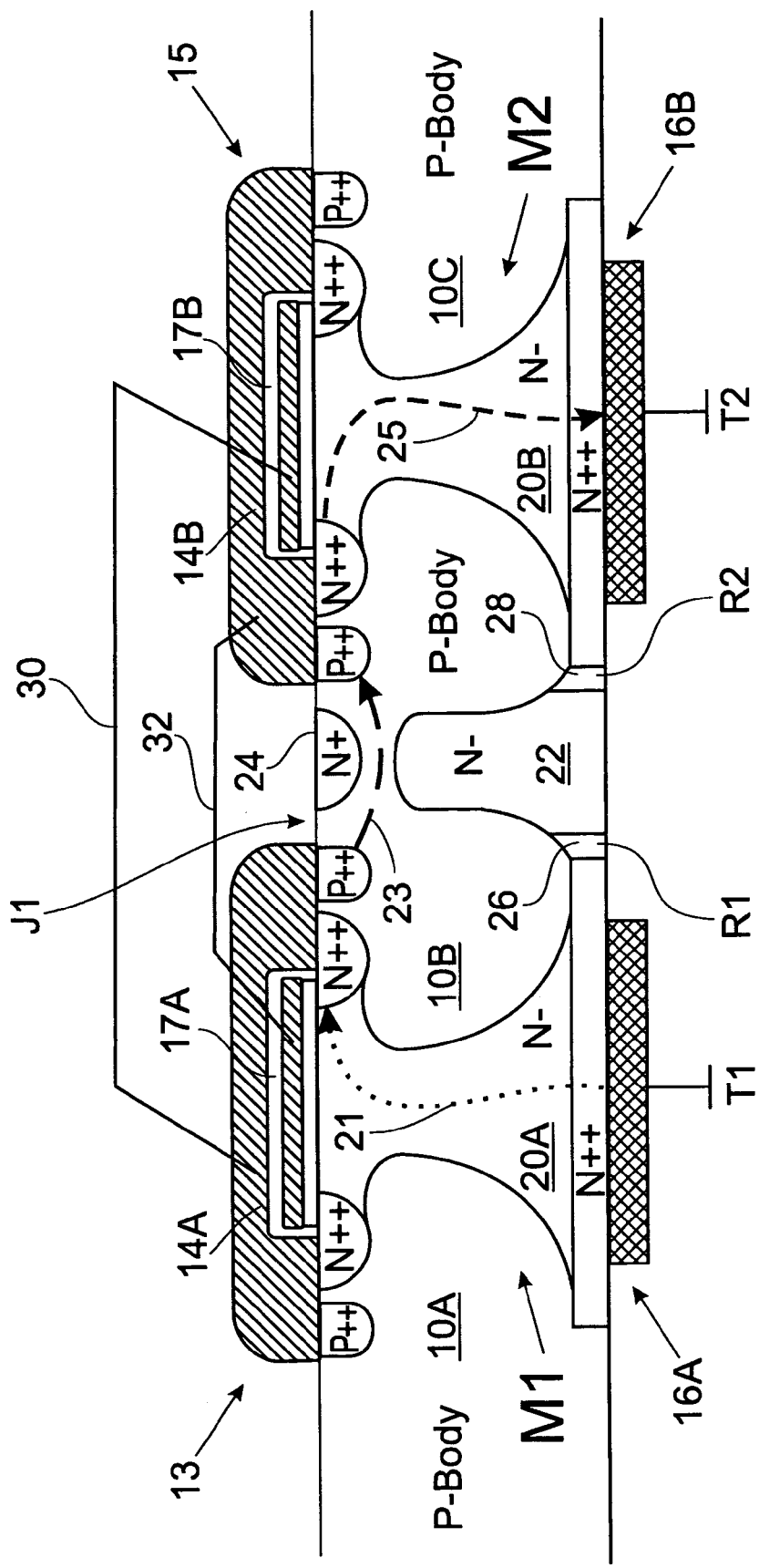
FIG. 6 is a diagram used to explain the operation of the integrated circuit of FIG. 5.

An example of the operation of the device of FIG. 5 will now be described with reference to FIG. 6. In FIG. 6 a positive voltage is taken to have been applied to external connection T1 relative to external connection T2. As a result a conventional current flows along a first channel, indicated by dotted line 21, of MOSFET M1. (Of course, the direction of electron flow would be opposite to the direction of the conventional current.) Channel 21 is of a first type of substrate being N doped silicon so that the majority carriers in the channel are electrons. The current flows under gate region 17A and into intermediate JFET J1 where it flows through a second channel as indicated by broken line 23 that traverses gate structure 22. Channel 23 is of a second type of substrate being P doped silicon so that the majority carriers in the channel are holes. The current then flows into MOSFET M2 through a further channel indicated by broken line 25 and out terminal T2 into a terminating device (not shown).

At this point it is important to note that gate structures 17A and 22 control the flow of current through channels 21 and 23. Gate 17A is maintained at about the same potential as a point at the end of channel 23 by means of metallic connector 32. Accordingly, as current through channels 21 and 23 increases, the potential applied to gate 17A, relative to the potential in the adjacent region of channel 21 decreases, so that a depletion region forms under gate 17A.

Similarly, gate 22 of JFET J1 is held at some significant proportion of the potential at the start of channel 21 due to insulating regions 26 and 28. Consequently, as current flows through channels 21 and 23 a potential difference develops between gate structure 22 and a point adjacent in channel 23. Depending on the magnitude of the potential difference, a significant depletion region may be produced in channel 23 adjacent gate 22.

In the event of a current surge into terminal T1 occurring, as might be associated with a lightning strike for example, then the depletion regions due to gate structures 17A and 22 will grow sufficiently to cause pinch-off of both channel 21 and channel 23 so that no further current flows through the device and isolation of terminal T2 from terminal T1 is achieved. In effect, a device connected to terminal T1 is disconnected from a line, such as a power line, connected to terminal T2.

It will be noted that the structure of the device of FIGS. 5 and 6 is symmetrical about gate 22. Consequently, although a unidirectional example of the operation of the device has been given, it will be realized that MOSFET M2 and JFET J1 act analogously to provide protection from current surges in the opposite direction to that in the above explanation.

The device of FIGS. 5 and 6 make use of vertical pass transistors M1 and M2 which is advantageous in applications where low on-resistance and high blocking voltage properties are indicated.

Figure 7:
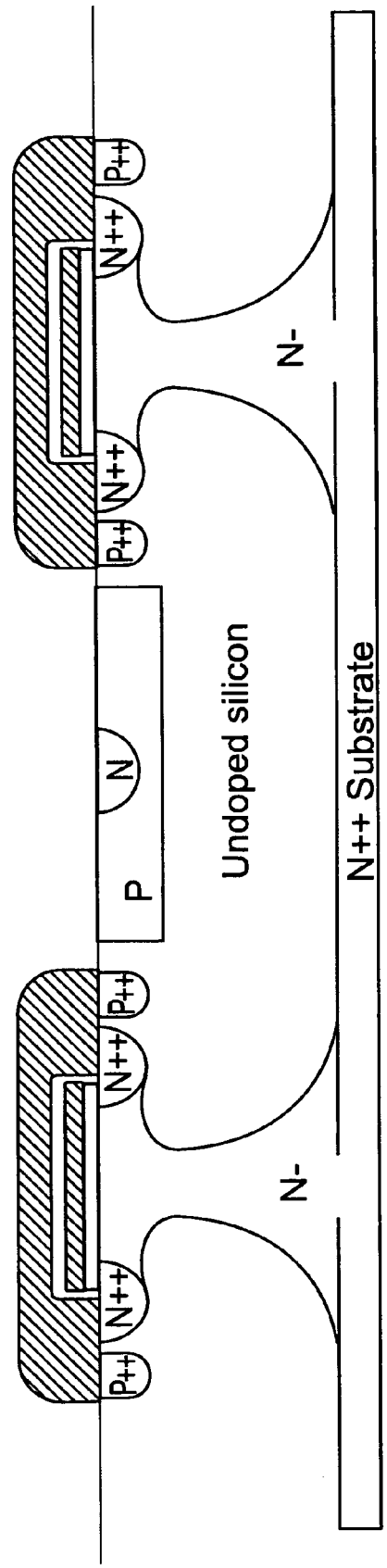
FIG. 7 is a cross section through an integrated circuit according to a further embodiment of the present invention.

With reference to FIG. 7, a variation to the arrangement of FIG. 5 is depicted which may be achieved by creating through-doped N regions in undoped silicon. Within the N silicon, and grown above the epitaxial layers, N channel FETs may be formed while above the intervening undoped regions the P channel FETs can be built.

Figure 8:
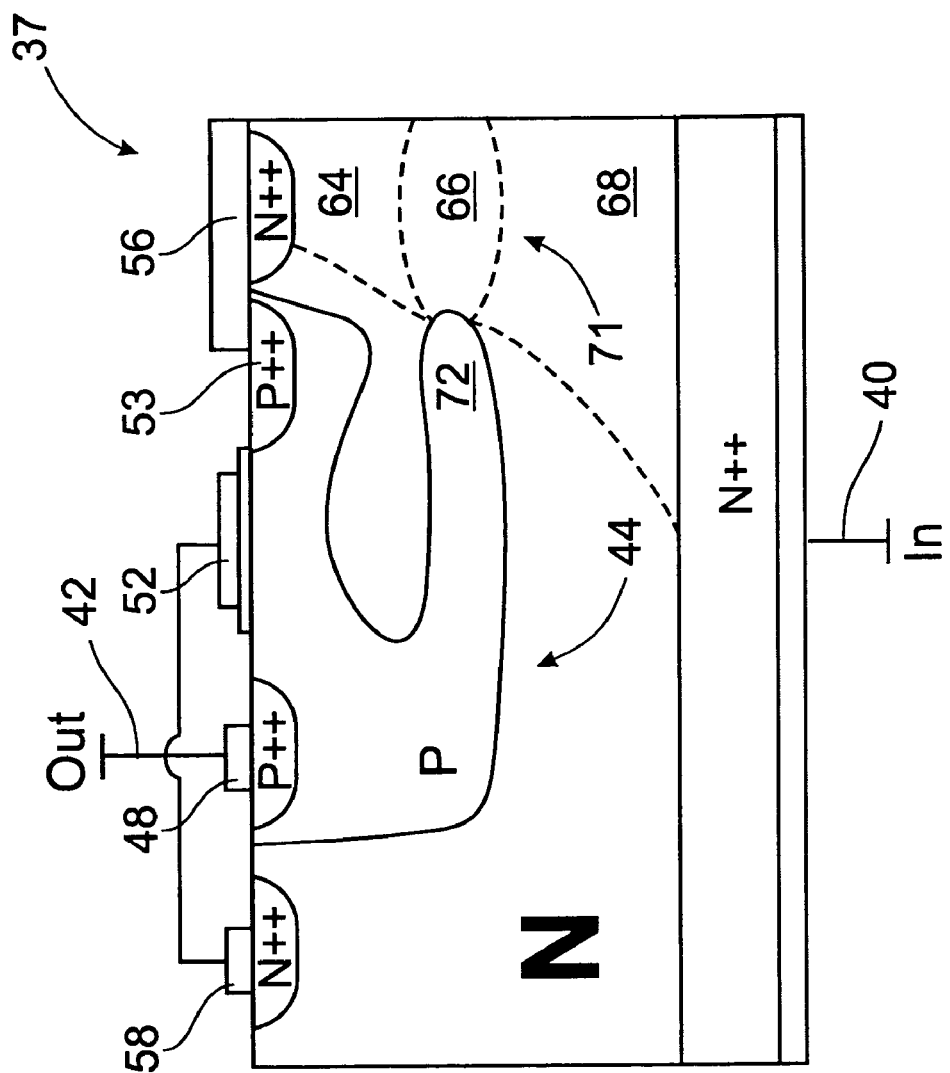
FIG. 8 is a cross section through an integrated circuit according to a unidirectional embodiment of the present invention.

FIG. 8 is a cross-section through an integrated circuit 37 according to a further embodiment of the invention. Integrated circuit 37 is arranged to provide unidirectional protection for a device connected to output terminal 42 from overload currents surging into terminal 40. Internally, IC 42 includes a P-Channel MOSFET structure 44. Along the right-hand side border of the cross section shown in FIG. 4D there is located a N-channel JFET structure 71. JFET structure 71 includes a source region 64 and a drain region 68 between which there is located a gate region 66 that is bordered by a tongue 72 of P-type material continuous with the body of MOSFET 44. Output terminal 42 is connected to drain terminal 48 of MOSFET 44. The source 53 of MOSFET 44 is connected by metal conductor 56, which is also connected to source region 64 of JFET structure 71.

The N-type body of IC 37 is connected, via contact 58 to gate 52 of MOSFET structure 44.

An explanation of the operation of device 37 will now be given with reference to FIG. 9. Upon a positive voltage being applied to terminal 40 conventional current flows in a channel indicated by arrow 85 from drain 68 through the gate region bordered by tongue 72 to the source of N-type JFET 71 and into metal conductor 56. Consequently current flows from conductor 56 through a channel indicated by arrow 77 in MOSFET 44. The current flows under gate 52 and subsequently out through terminal 42 to supply a device connected at that terminal in use.

It will be noted that a potential difference $V_d$ exists between the In terminal 40 and the N type channel, indicated by arrow 85, of IC 41 due to the inherent resistances of the P-type and N-type substrates. As the current through the In terminal (and hence through JFET 71) increases, the potential difference $V_d$ also increases. As previously mentioned, $V_d$ is applied to gate 52 by virtue of an external connection from connector 58. As $V_d$ increases, depletion region 73 grows beneath gate 52. Simultaneously, in the JFET gate region adjacent MOSFET tongue 72, a depletion region 81 grows. Eventually $V_d$ reaches a level where either the N-channel JFET 71 or the P-channel MOSFET 44 reaches pinch-off. Upon either the JFET or the MOSFET reaching pinch-off, a large voltage is produced across IC 41, which causes both MOSFET 44. and JFET 71 to turn off completely, thereby isolating output terminal 42 from input terminal 40 and protecting a device connected to terminal 42 from the current surge.

As was previously mentioned, IC 41 is a unidirectional current blocking device. (That is, it will block positive transients at the input terminal, but will not block negative transients.) A bidirectional device may be readily adapted from IC 41 by mirroring MOSFET structure 44 along the bottom of IC 49 with an additional MOSFET structure 45 as shown in FIG. 10 or alternatively mirroring the device on the top side, in a side-by-side fashion. That is, the integrated circuit of FIG. 10 provides blocking of transient currents flowing from the Out terminal to the In terminal and vice-versa. The operation of the bidirectional transient current blocking device is analogous to the unidirectional device of FIGS. 8 and 9. It will also be realized that the structure of the embodiment of FIG. 10 is similar to that of FIG. 6. However, whereas the JFET in the embodiment of FIG. 6 was lateral and the MOSFETs were vertical, the MOSFETs in the embodiment of FIG. 10 are lateral and the JFET 46 is vertical. The use of lateral pass transistors is advantageous where it is desired to integrate the surge protection apparatus with other circuits.

Figure 9:
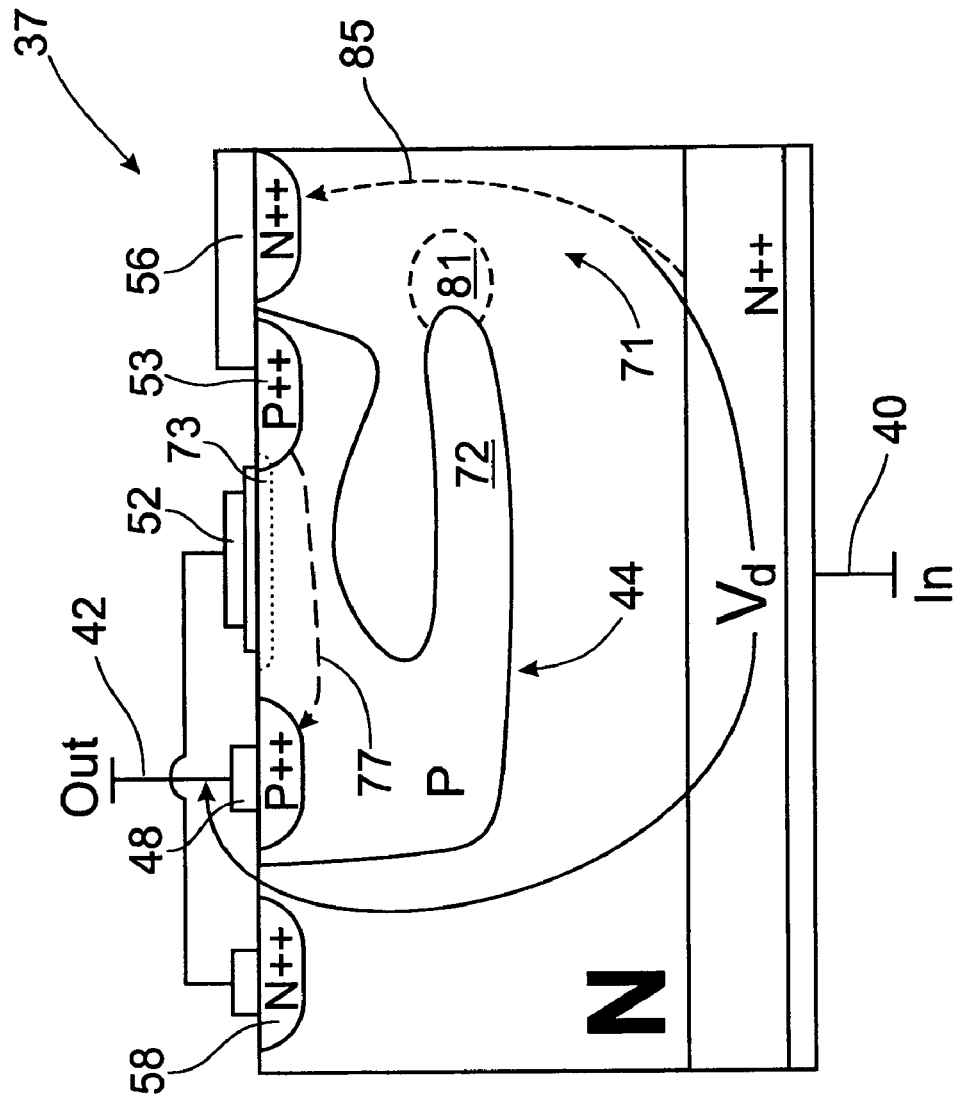
FIG. 9 is a diagram used to explain the operation of the integrated circuit of FIG. 8.
Figure 10:
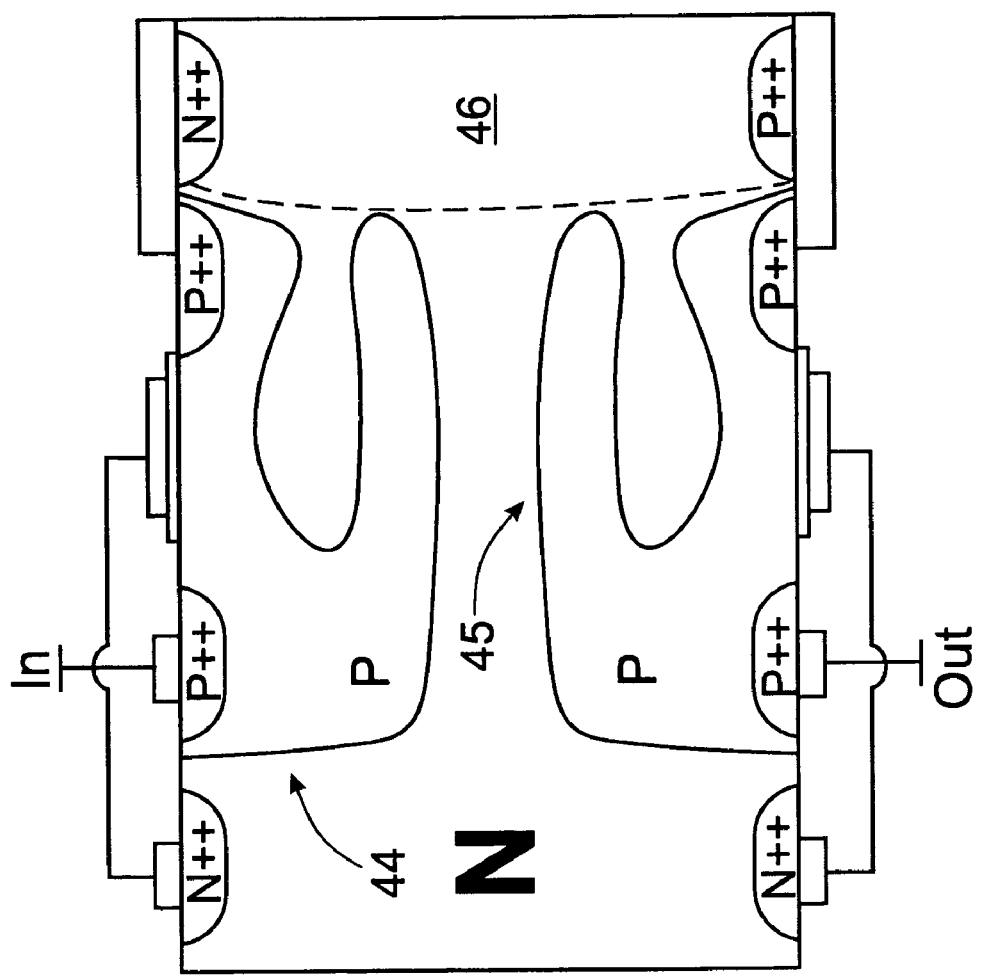
FIG. 10 is a cross section through a bidirectional variation of the embodiment of FIG. 8.
Figure 11:
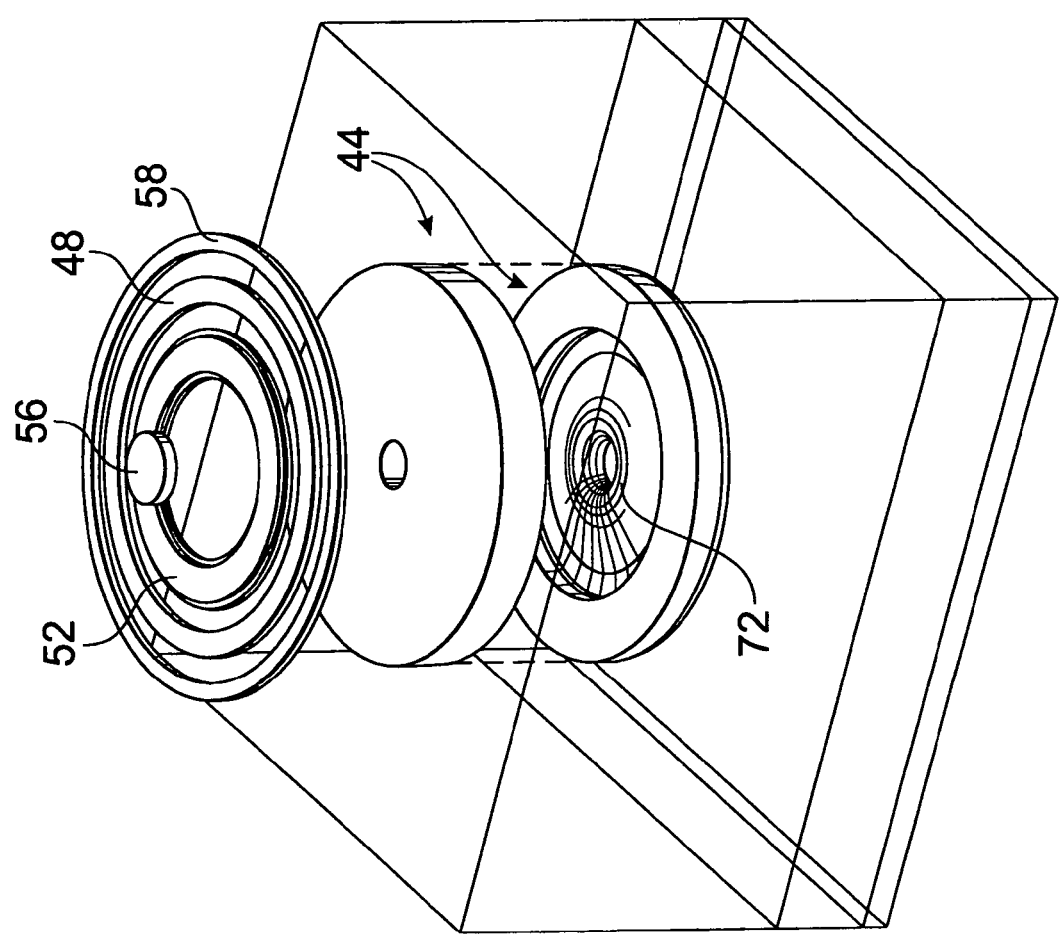
FIG. 11 is an exploded perspective view of a unidirectional embodiment of the invention having a cross section as shown in FIG. 13.
Figure 12:
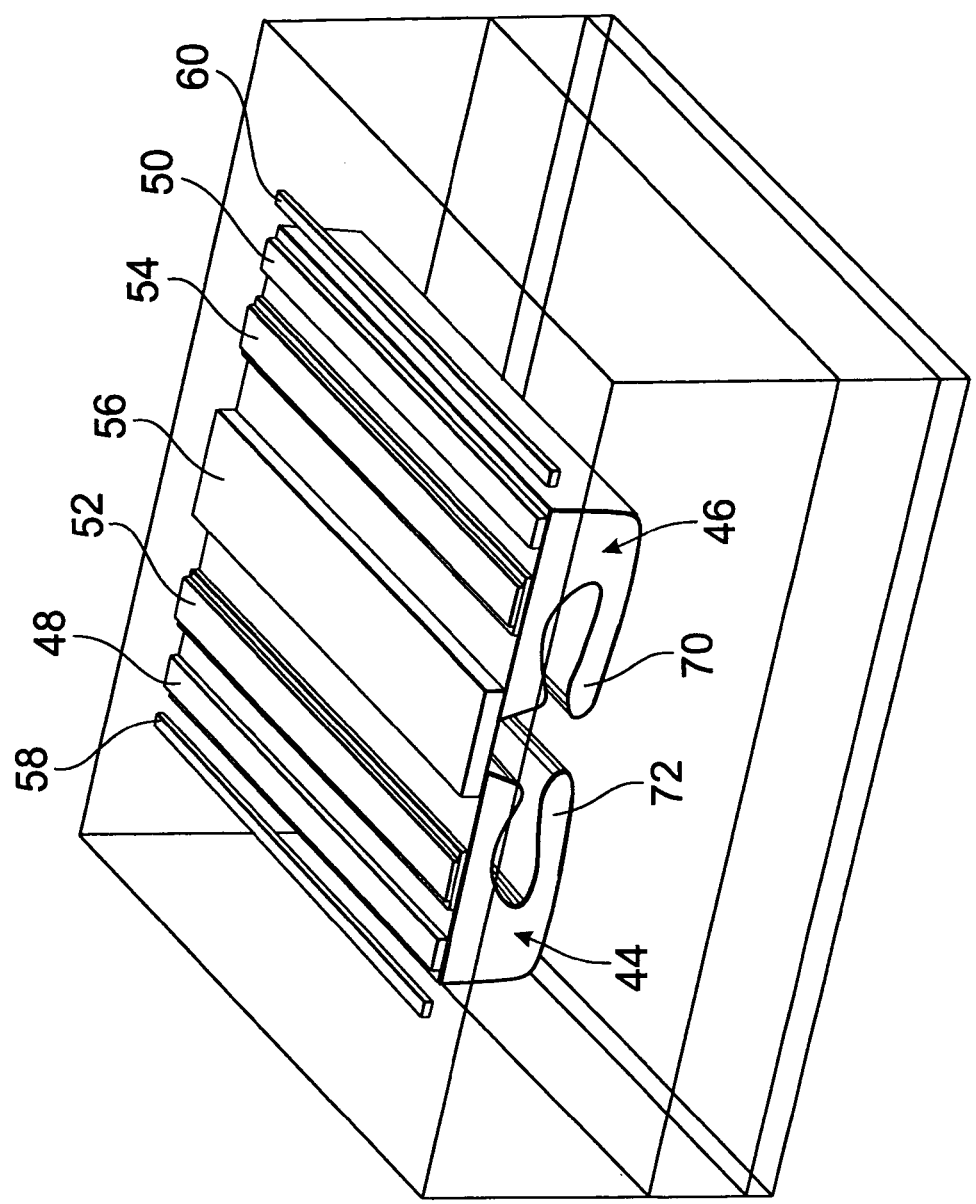
FIG. 12 is a perspective view of a further unidirectional embodiment of the invention also having a cross section as depicted in FIG. 13.

In order to increase current handling capability, the MOSFET structure 44 shown in FIGS. 8 and 9 may be varied to provide a greater volume of P-type material. For example, FIG. 11 depicts, in exploded view, an embodiment of the integrated circuit wherein MOSFET structure 44 and associated terminals are configured as a number of loops. In particular, MOSFET structure 44 and its associated terminals have been swept through 360° to form a volume of revolution. A further embodiment of the invention is shown in FIG. 12 wherein MOSFET structure 44 is provided in a strip configuration and is along one side with an additional MOSFET structure 46 having a tongue region 70. Terminals 58, 48 and 52 are similarly mirrored by additional corresponding terminals 60, 50 and 54 respectively.

Figure 13:
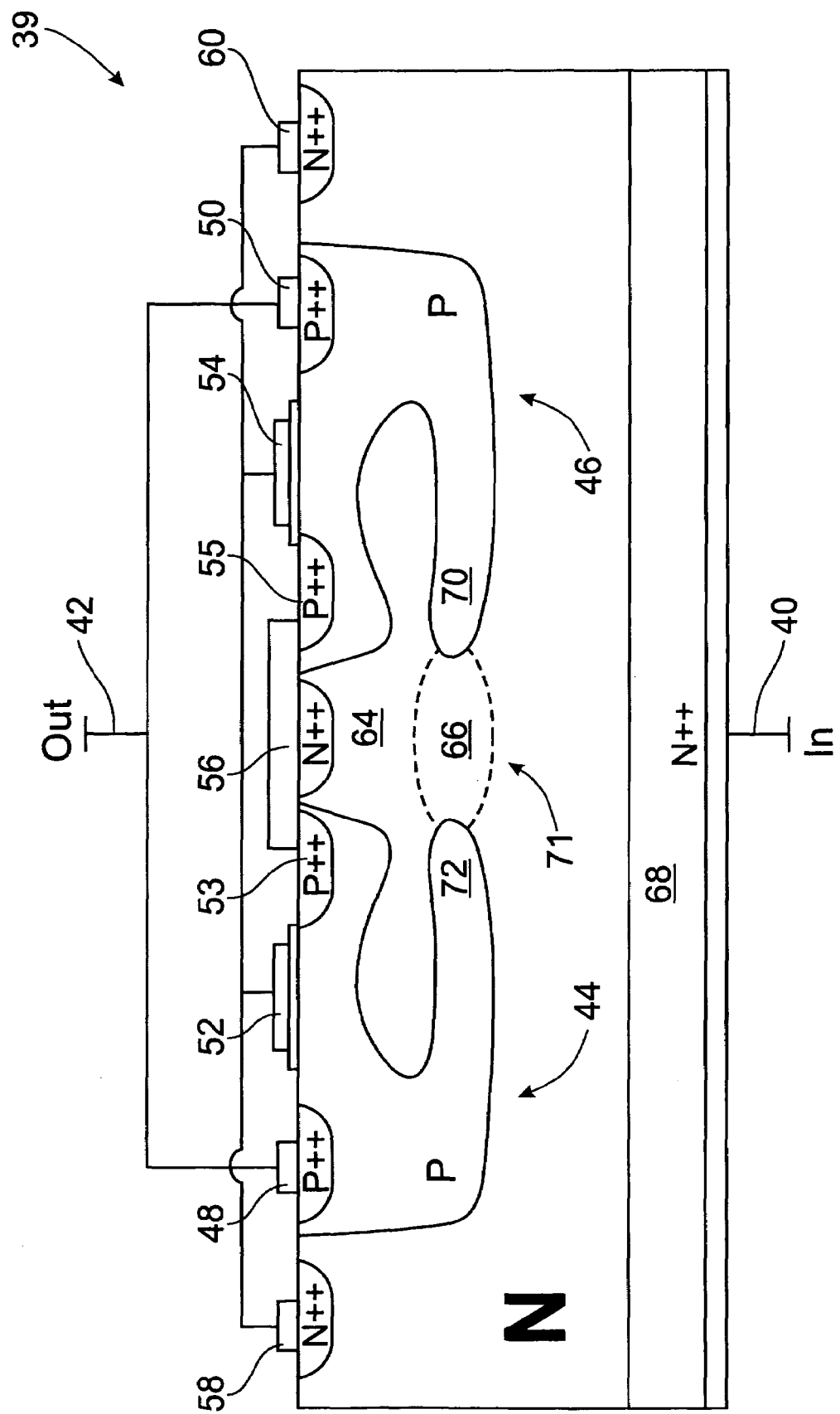
FIG. 13 is a cross section through an integrated circuit according to a further embodiment of the present invention.

FIG. 13 is a cross-section through the embodiment of FIG. 11 showing the external electrical connections.

Integrated circuit 39 is arranged to provide unidirectional protection for a device connected to output terminal 42 from overload currents surging into input terminal 40. Internally, IC 39 features two P-channel MOSFET structures 44 and 46 as also shown in FIG. 12. Between MOSFET structures 44 and 46 there is located an N-channel JFET structure 71. JFET structure 71 includes a source region 64 and a drain region 68 between which there is located a gate region 66 defined by opposing tongues 72 and 70 of P-type material continuous with the bodies of MOSFETs 44 and 46. These would typically be fabricated by a patterned "buried layer" diffusion, which merges with an N type reachthrough implant under the N++ drain regions 48 and 50. The use of a gap between buried-layer diffusions to define the channel of the blocking transistor has the advantage of providing a high breakdown-voltage device with good process integration capability.

Output terminal 40 is connected in parallel to drain terminals 48 and 50 of MOSFETs 44 and 46 respectively. The sources 53, 55 of MOSFETs 44 and 46 are connected by metal conductor 56, which is also connected to source region 64 of JFET structure 71.

The N-type body of the IC 39 is connected, via contacts 58 and 60, to gates 52 and 54 of MOSFET structures 44 and 46.

Figure 14:
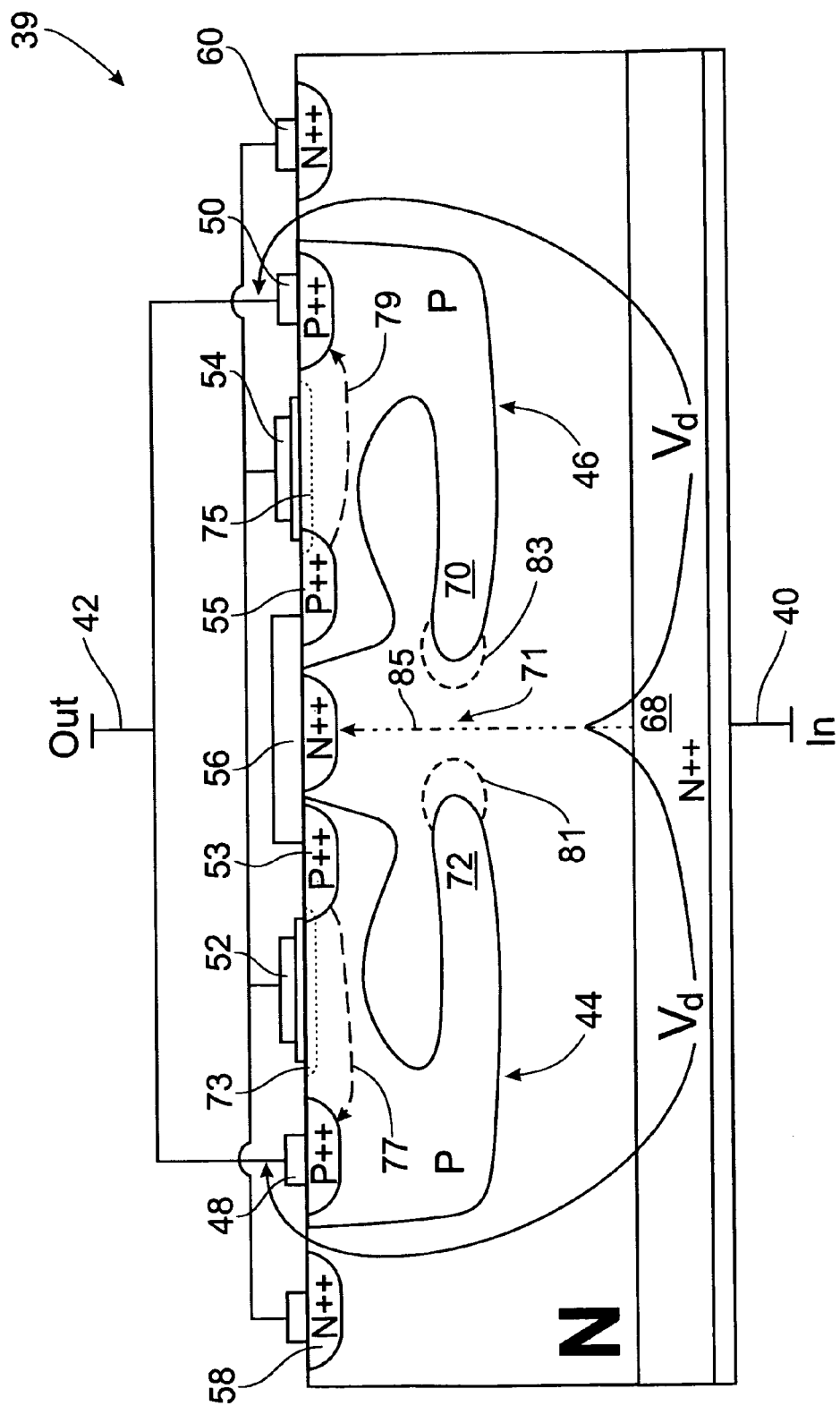
FIG. 14 is a diagram used to explain the operation of the integrated circuit of FIG. 13.

An explanation of the operation of device 39 will now be given with reference to FIG. 14. Upon a positive voltage being applied to terminal 40, conventional current flows from drain 68 through the gate region defined by tongues 72 and 70 as indicated by arrow 85 to the source of N-type JFET 71 and into metal conductor 56. Consequently current flows from conductor 56 through a pair of channels indicated by arrows 77 and 79 in MOSFET 44 and 46 respectively. The current flows under gates 52 and 54 respectively and subsequently out through terminal 42 to supply a device connected at that terminal in use.

It will be noted that a potential difference $V_d$ exists between the In terminal 40 and the N type center of IC 39 due to the inherent resistances of the P-type and N-type substrates. As the current through the In terminal, and hence through JFET 71, increases the potential difference also increases. As previously mentioned, $V_d$ is applied to gates 52 and 54 by virtue of external connections from connectors 58 and 60. As $V_d$ increases, depletion regions 73 and 75 grow beneath gates 52 and 54. Simultaneously, in the JFET gate region between MOSFET tongues 72 and 70, depletion regions 81 and 83 grow. Eventually $V_d$ reaches a level where either the N-channel JFET 71 or the P-channel MOSFETs 44 and 46 reach pinch-off. Upon either the JFET or the MOSFETs reaching pinch-off a large voltage is produced across IC 39 which causes both MOSFETs 44 and 46 and JFET 71 to turn off completely thereby isolating output terminal 42 from input terminal 40 and protecting a device connected to terminal 42 from the current surge.

Figure 15:
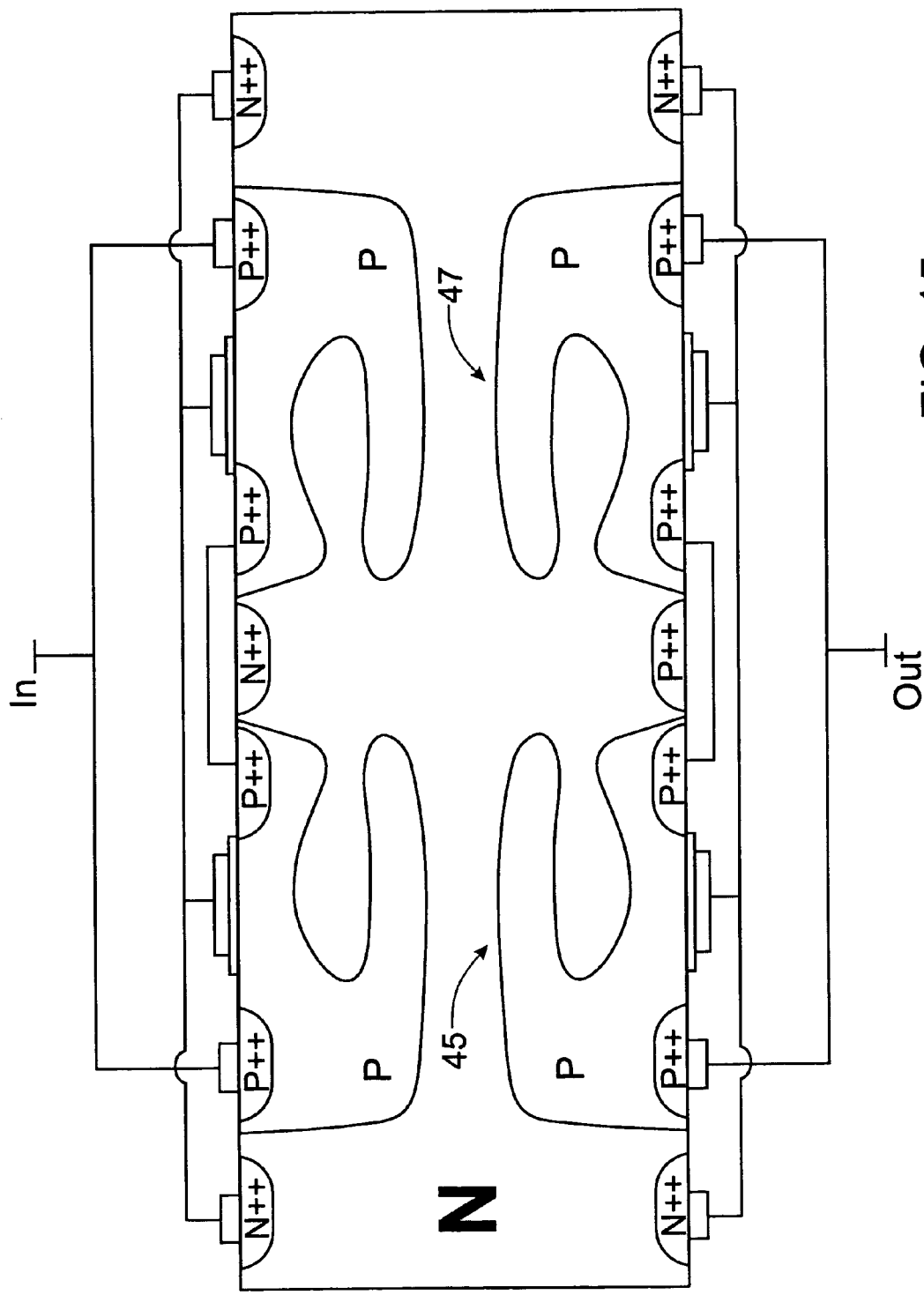
FIG. 15 is a cross section through a bidirectional variation of the embodiment of FIG. 13.

As was previously mentioned, IC 39 is a unidirectional current blocking device. (That is, it will block positive transients at the input terminal, but will not block negative transients.) A bidirectional device may be readily adapted from IC 39 by mirroring the MOSFET structures 44 and 46 along the bottom of the IC 39 with MOSFET structures 45 and 47 as shown in FIG. 15 or alternatively mirroring the device on the top side, in a side-by-side fashion. That is, the integrated circuit of FIG. 15 provides blocking of transient currents flowing from the Out terminal to the In terminal and vice-versa. The operation of the bidirectional transient current blocking device is analogous to the unidirectional device of FIGS. 13 and 15.

Figure 16:
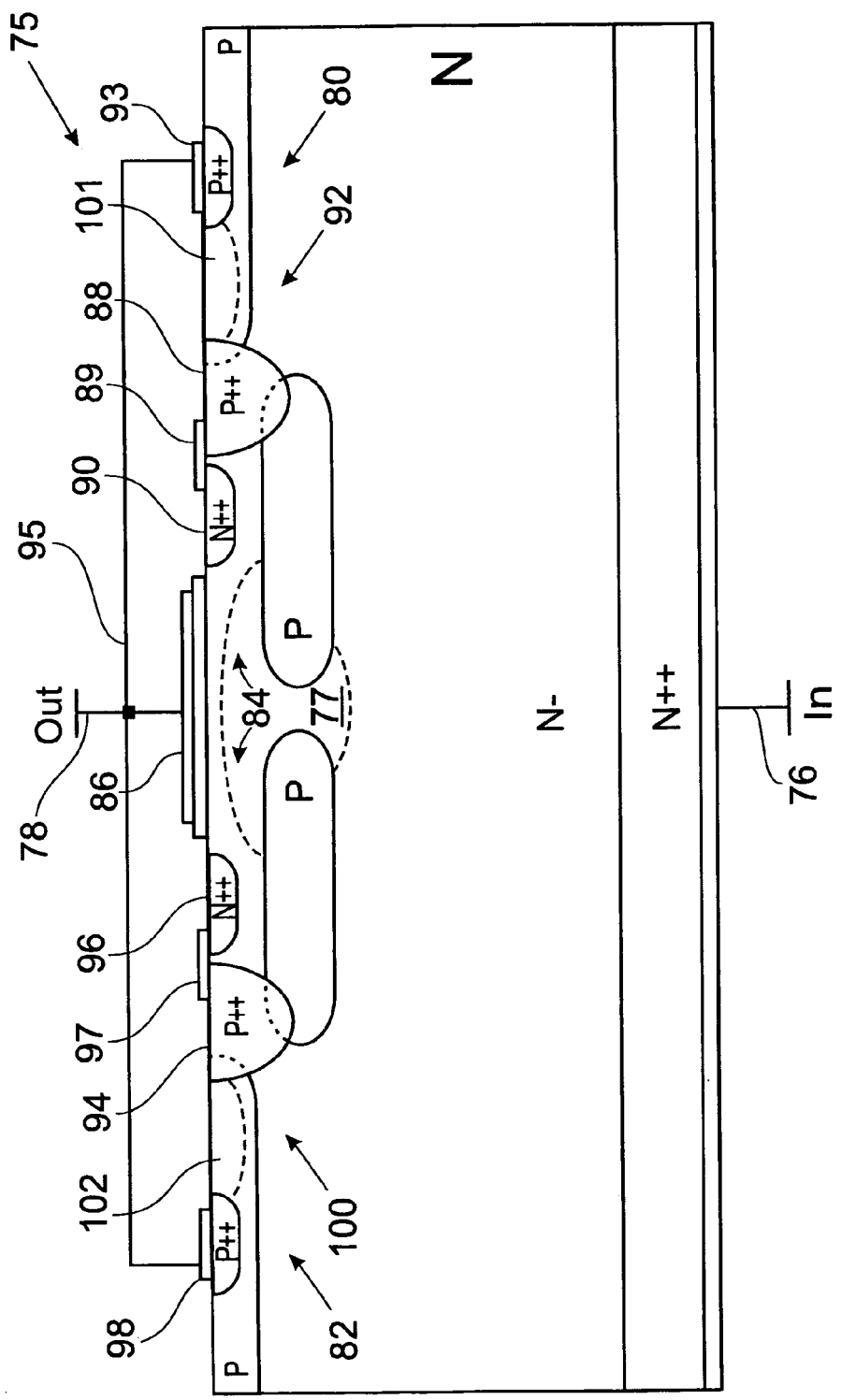
FIG. 16 is a cross section through an integrated circuit according to a further unidirectional embodiment of the present invention.

FIG. 16 is a cross section through an integrated circuit 75 according to a further embodiment of the present invention. Integrated circuit 75 may be configured as either a ring structure, similar to the embodiment of FIG. 11, or a strip structure similar to the embodiment of FIG. 12. Integrated circuit 75 is arranged to provide unidirectional protection for a device connected to output terminal 78 from conventional current surges flowing into input terminal 76. Internally, IC 75 features two P-channel JFET structures 80 and 82 between which there is located an N-channel MOSFET structure 84 having a gate 86.

Source 88 of JFET 80 is connected to a first source 90 of MOSFET 84 by metal conductor 89. A gate region 92 separates source 88 from drain 93. Drain 93 is connected to Out terminal 78 and also to gate 86 of MOSFET 84 by external connectors 95. Similarly, source 94 of JFET 82 is connected to a second source region 96 of JFET structure 84 by metal conductor 97. Drain 98 is connected to Out terminal 78 and to MOSFET gate 86 by external connectors 95.

Figure 17:
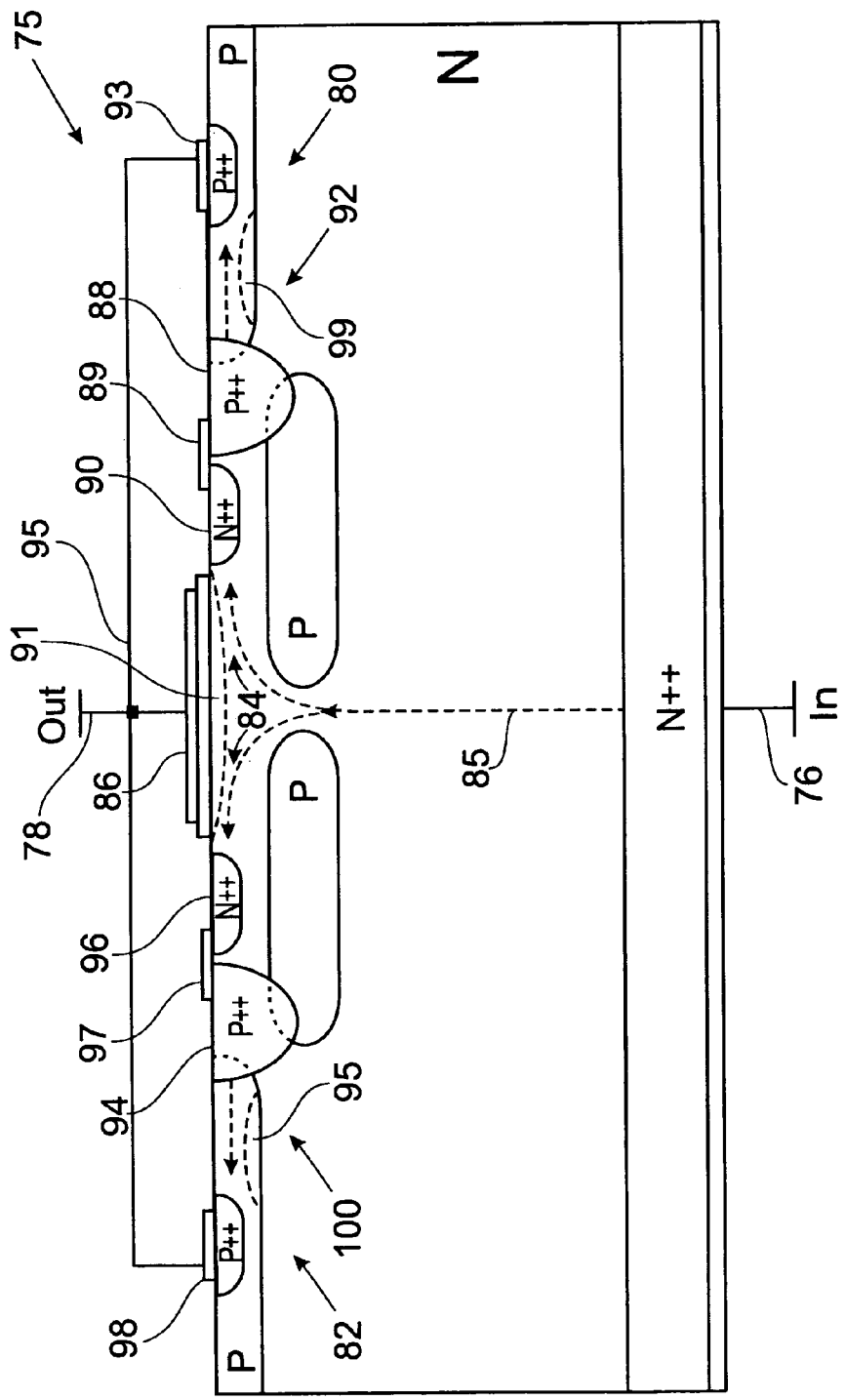
FIG. 17 is a diagram used to explain the operation of the integrated circuit of FIG. 16.

The operation of IC 75 will now be explained with reference to FIG. 17. During standard operation, positive current flows into In terminal 76, for example from a power supply line, and up through the drain region of MOSFET 84 via a first channel indicated by arrow 85. The current then proceeds through source 90 of MOSFET 84 into source 88 of JFET 80 via metallized contact 89. Similarly, current proceeds through source 96 of MOSFET 84 and into source 94 of JFET 82 via contact 97.

It will be realized that the potential at the drain region of MOSFET 84 is higher than at the drain of JFET 80 so that JFET gate region 92 is slightly depleted of carriers in region 99. Similarly there is a slight depletion in region 95 of JFET 82. Current flows from JFET drains 93 and 98 through external electrical connections 95 and out output terminal 78. It will also be realized that the potential at the drain region of MOSFET 84 is greater than at JFET drains 93 and 98 due to inherent resistance of the N-type material and the P-type material of JFETs 80 and 82. Since drains 93 and 98 are electrically connected to MOSFET gate 86, the gate is biased to produce a slight depletion of carriers in region 91.

In the event that there is a surge of current into terminal 76, for example as might be associated with a transient over-voltage due to a lightning strike, then the potential of the drain region of MOSFET 84 and gate regions 92 and 100 will increase, thus increasing the depletion regions of the P-N junctions in MOSFET 84 and gates 92 and 100. As the depletion regions grow they restrict current flow, and thereby further increase the potential difference $V_d$ between the drain region of MOSFET 84 and JFET drains 93 and 98. Eventually $V_d$ reaches a level where either the P-channel JFETs 80 and 82 or the N-channel MOSFET 85 reaches pinch-off. Upon either the JFET or the MOSFETs reaching pinch-off a large voltage is produced across IC 75 which causes both MOSFET 84 and JFETs 80 and 82 to turn off completely, thereby isolating output terminal 78 from input terminal 76 and protecting a device connected to terminal 78 from the current surge.

Figure 18:
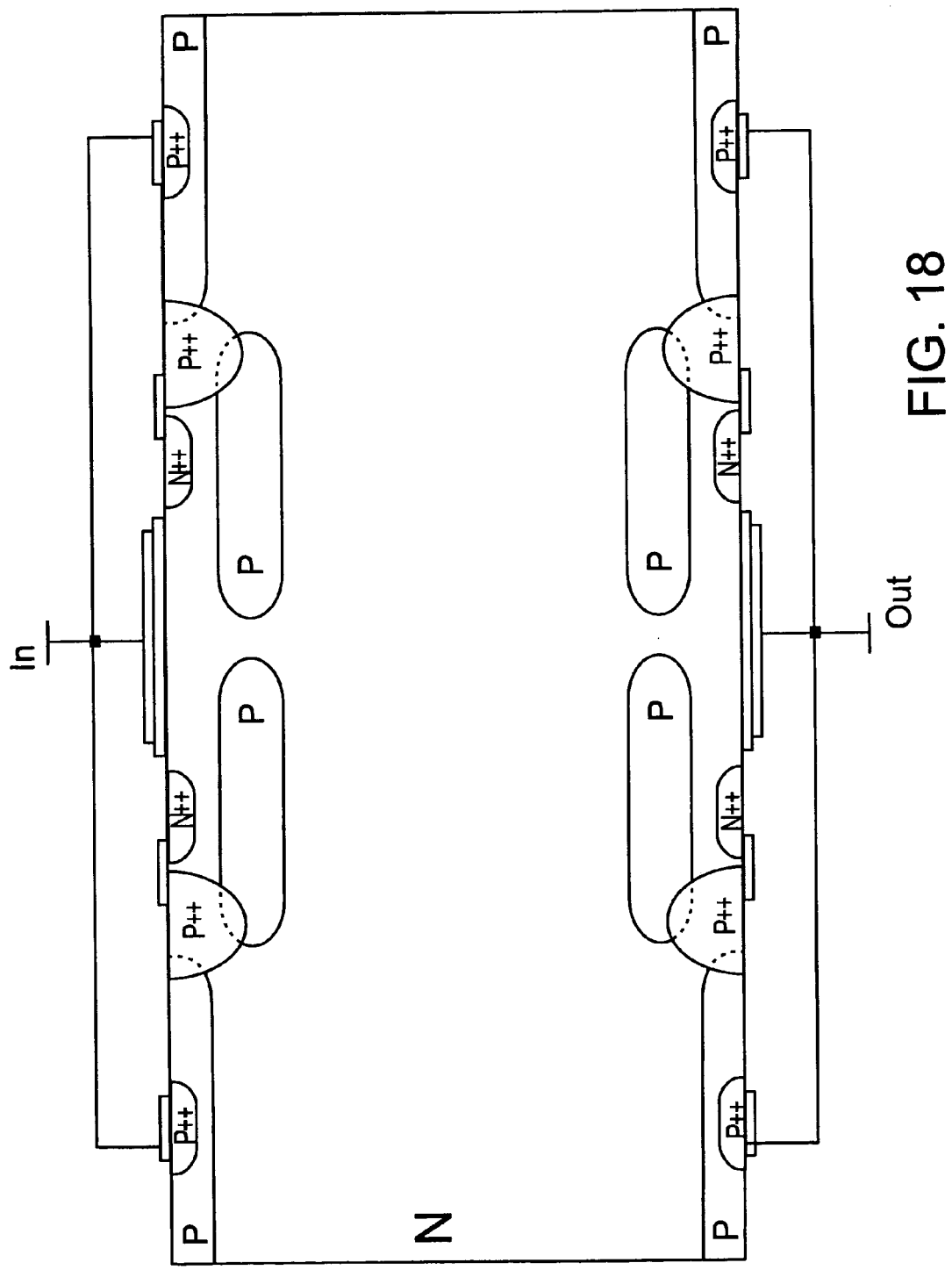
FIG. 18 is a cross section through a bidirectional variation of the embodiment of the FIG. 16.

As previously mentioned, IC 75 is configured to provide unidirectional protection from a surge of current into terminal 76. One possible arrangement for a bidirectional variation of the embodiment of IC 75 is shown in FIG. 18.

Figure 19:
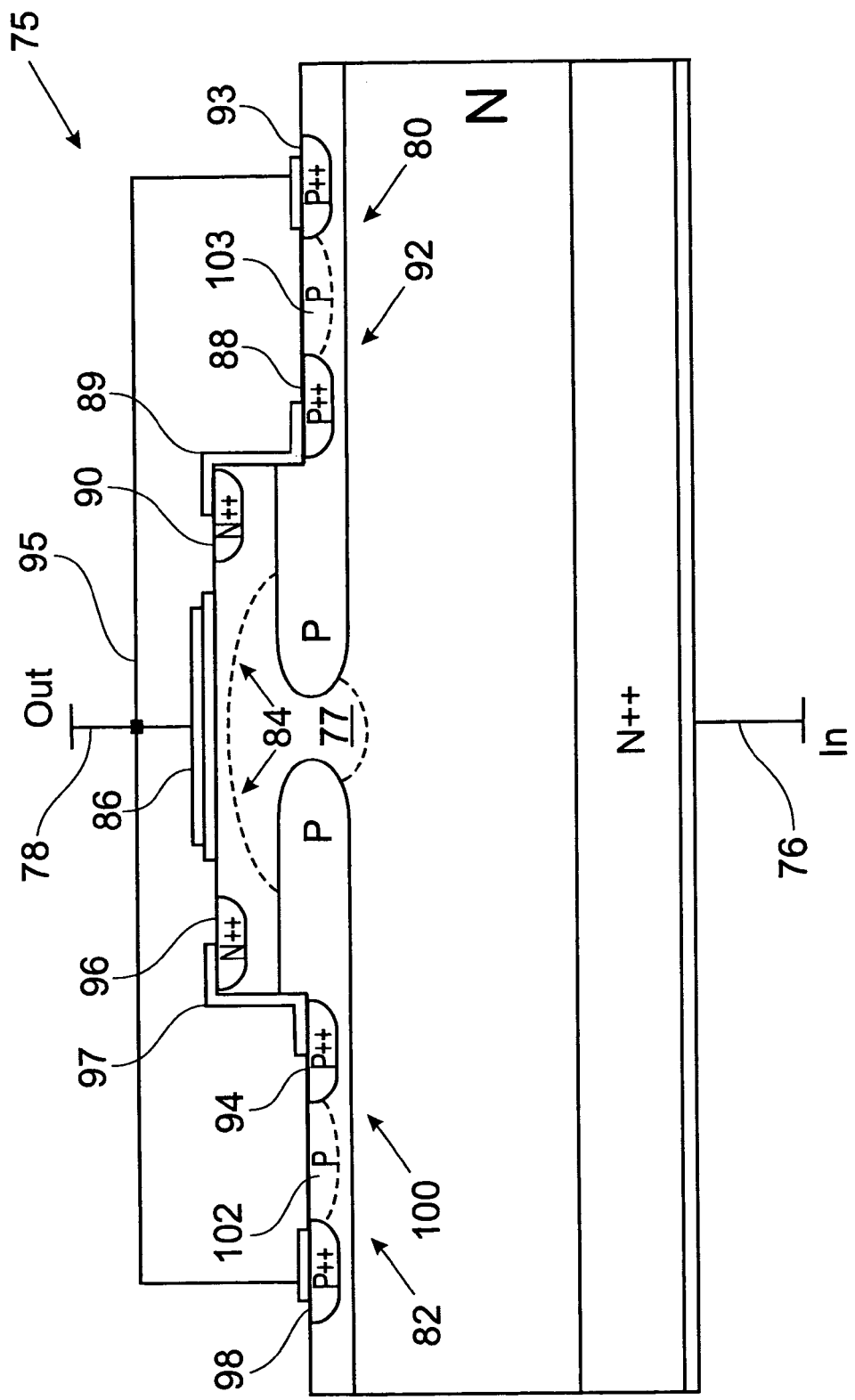
FIG. 19 is a cross section through a further variation of the unidirectional embodiment of FIG. 16.

Referring now to FIG. 19, a variation to the arrangement of FIG. 16 is depicted which may be achieved by etching part of the top N region to get access to the buried P-type regions in which the two P-channel JFET structures 80 and 82 featured. Due to the higher concentration of P-buried regions relative to the N– drift region, the concentration in the P-channel of JFETs 102 and 103 need to be adjusted by implanting/diffusing N-type dopant to achieve a desired pinch-off current in the P-channel JFETs.

Figure 20:
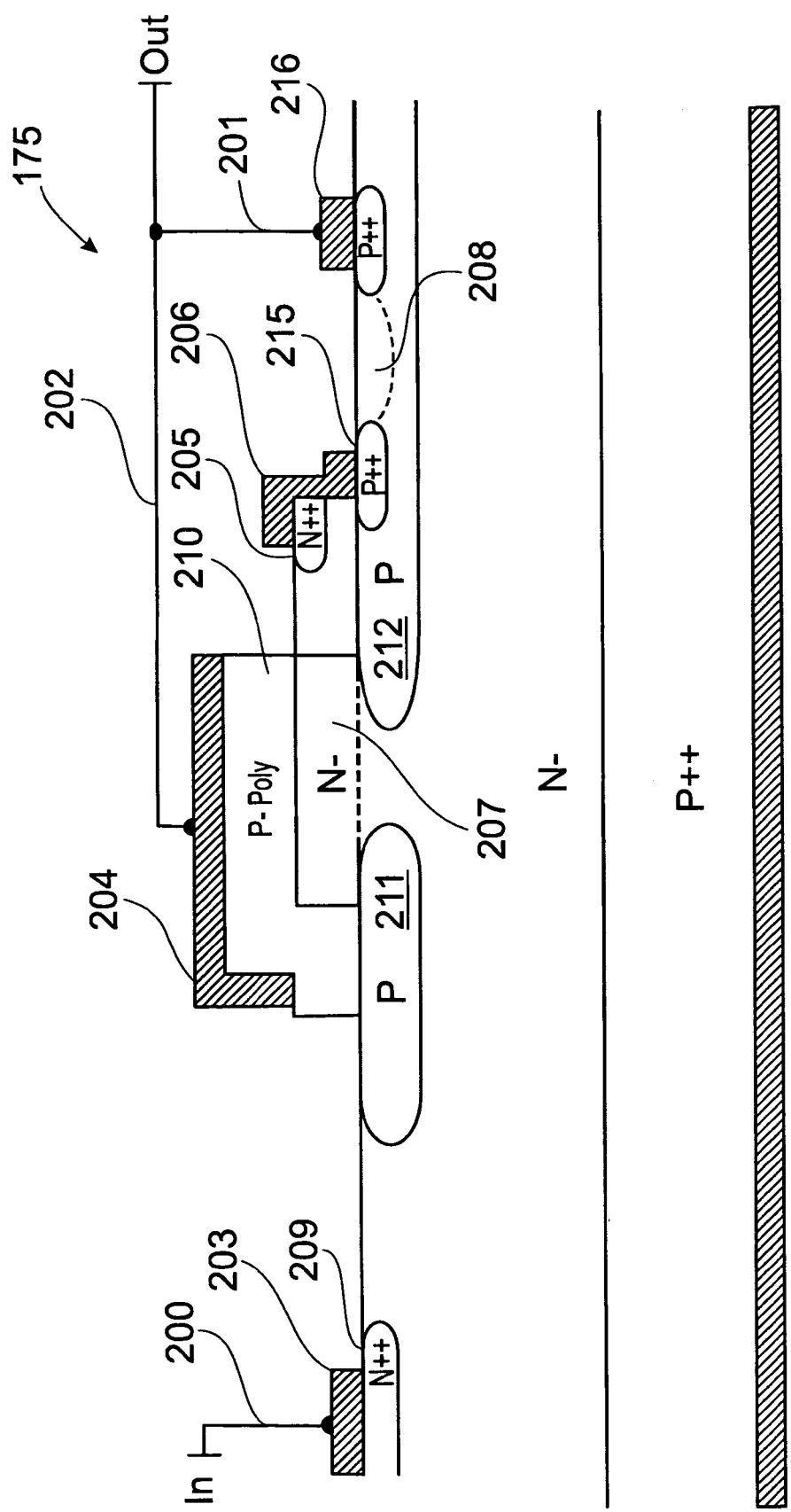
FIG. 20 is a cross section through an integrated circuit according to a preferred unidirectional embodiment of the present invention.

FIG. 20 is a cross-section through an integrated circuit 175 according to a further embodiment of the invention. Integrated circuit 175 is arranged to provide unidirectional. protection for a device connected to output terminal 201 from overload currents surging into input terminal 200. Internally, IC 175 features lateral N-channel and P-channel FET structures 207 and 208 respectively connected in series. The lateral N-FET structure includes a drain region 209 and a source region 205 between which there is located a gate region 207 defined by P-type polysilicon gate material 210 and the opposing P-Buried regions 211 and 212, in which one of the P-Buried region (212) embodies the P-FET. Input terminal 200 is connected in series to drain region 209 of the N-FET via contact 203. The source region of N-FET 205 is connected by metal conductor 206, which is also connected to source region 215 of the P-FET structure. The P-type drain of JFET 208 is connected to the Out terminal 201 via contact 216 and to the gate contact 204 of the N-FET structures by external conductor 202.

Figure 21:
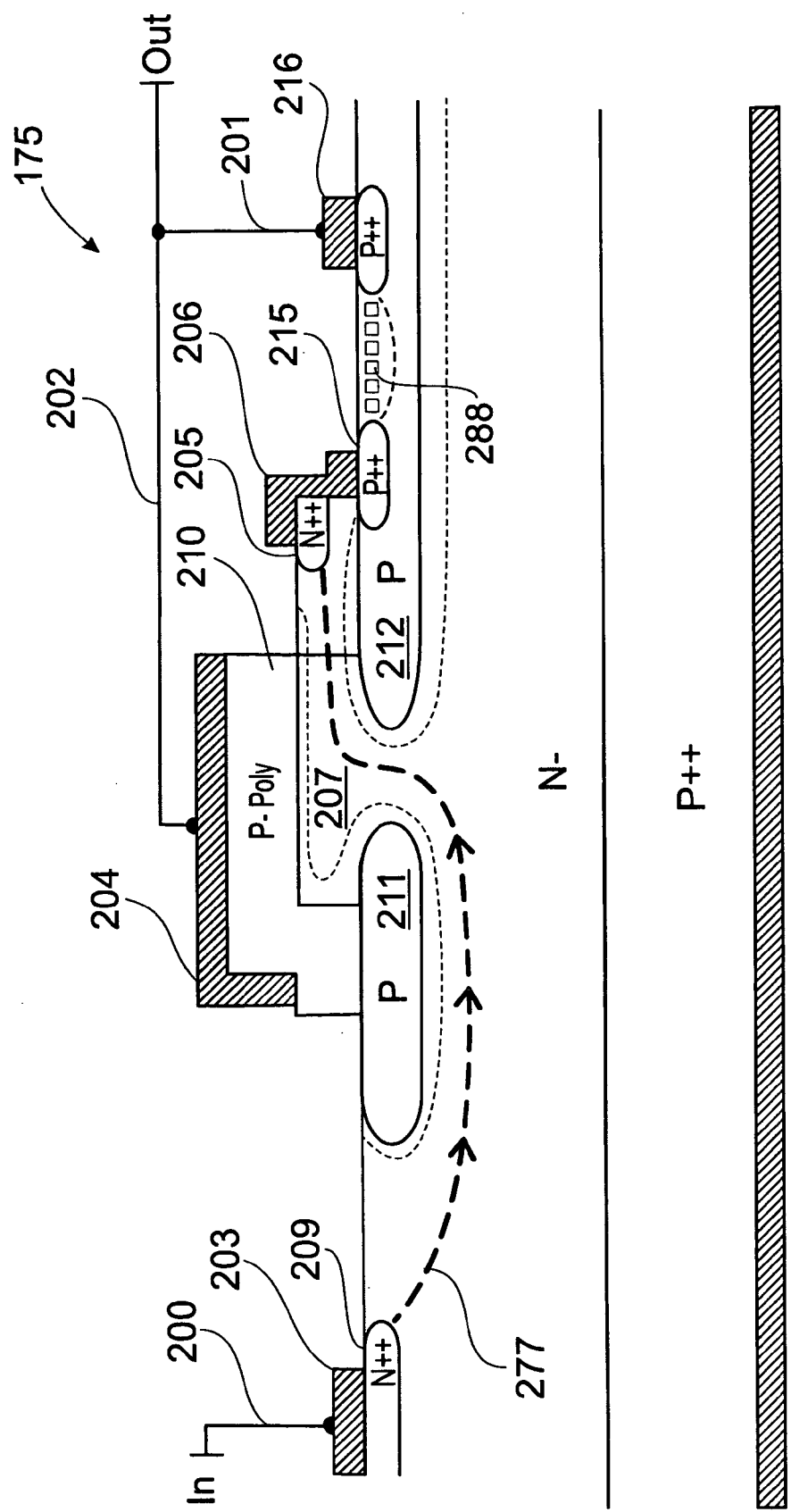
FIG. 21 is a diagram used to explain the operation of the integrated circuit of FIG. 20.

An explanation of the operation of device 175 will now be given with reference to FIG. 21. Upon a positive voltage being applied to terminal 200, conventional current flows from drain 209 through N-channel 207 into metal conductor 206 as indicated by arrows 277. Consequently current flows from conductor 206 through P-channel 208, indicated by arrow 288, out through drain terminal 201 to supply a device connected at that terminal.

As the current through the In terminal increases, the potential difference between the In terminal 200 and the Out terminal 201 also increases. As previously mentioned, the Out terminal is applied to gate contact 204 by virtue of external connection 202. As the potential difference increases, depletion regions under P-type polysilicon 207 and in P-channel region 208 grow. It may be noted that depletion in P-channel region 208 is driven by the potential of the N– epi-layer which is at the potential of 209, i.e. the drain region of N-channel 207. Simultaneously, depletion regions grow in between the two P-Buried regions 211 and 212. Eventually the depletion regions grow to a level where either the P-channel FET 208 or the N-channel FET 207 reach pinch-off. Upon either the P-FET or the N-FET reaching pinch-off a large voltage is produced across IC 175 which causes both FETs to turn off completely thereby isolating output terminal 201 from input terminal 200 and protecting a device connected to terminal 201 from the current surge.

Figure 22:
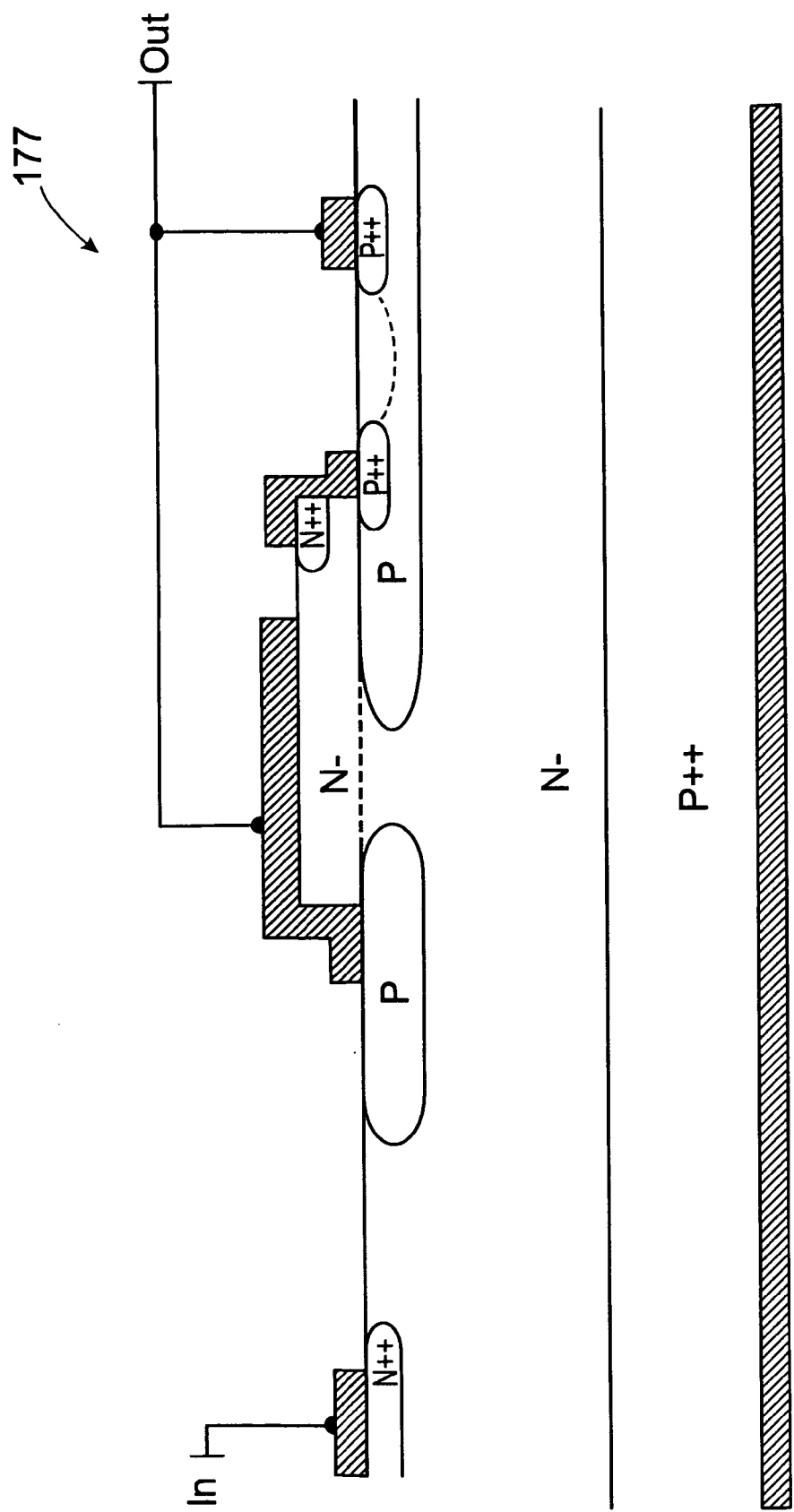
FIG. 22 is a metal only variation of the integrated circuit of FIG. 20.

FIG. 22 is a cross section through a metal-only variation of FIG. 20.

Figure 23:
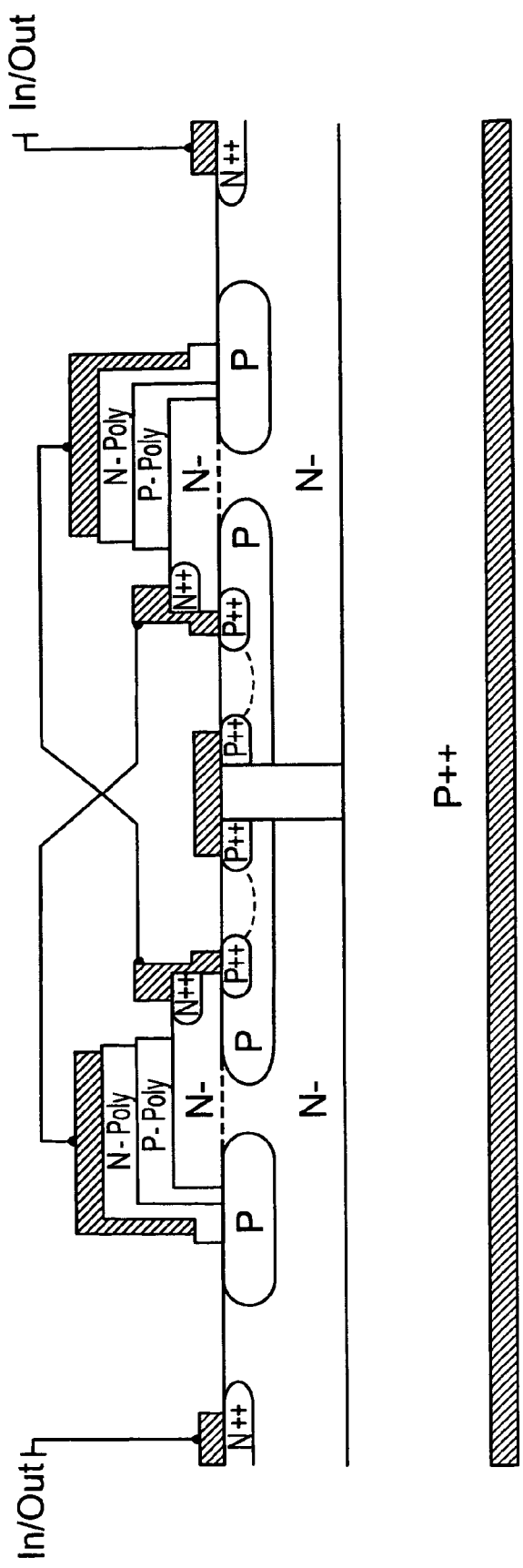
FIG. 23 is a cross section through a preferred bidirectional variation of the embodiment of FIG. 20.

As was previously mentioned, IC 175 is a unidirectional current blocking device. A bidirectional device may be readily adapted from IC 175 by horizontally mirroring the structure as shown in FIG. 23 and adding an extra layer on the gate to prevent gate shorts with the active regions of the device. Isolation between the mirrored structures may be achieved by etching the N-epitaxial layer and creating a bridged connection to the two mirrored structures above isolating material such as oxide 300. Alternatively, a P++ region may be created in between the two mirrored structures thereby avoiding the need for an external connection between the two mirrored structures. The operation of the bidirectional transient current blocking device is analogous to the unidirectional device of FIGS. 20 and 21. Note, however, that a poly diode is added to prevent cross-conduction.

Figure 24:
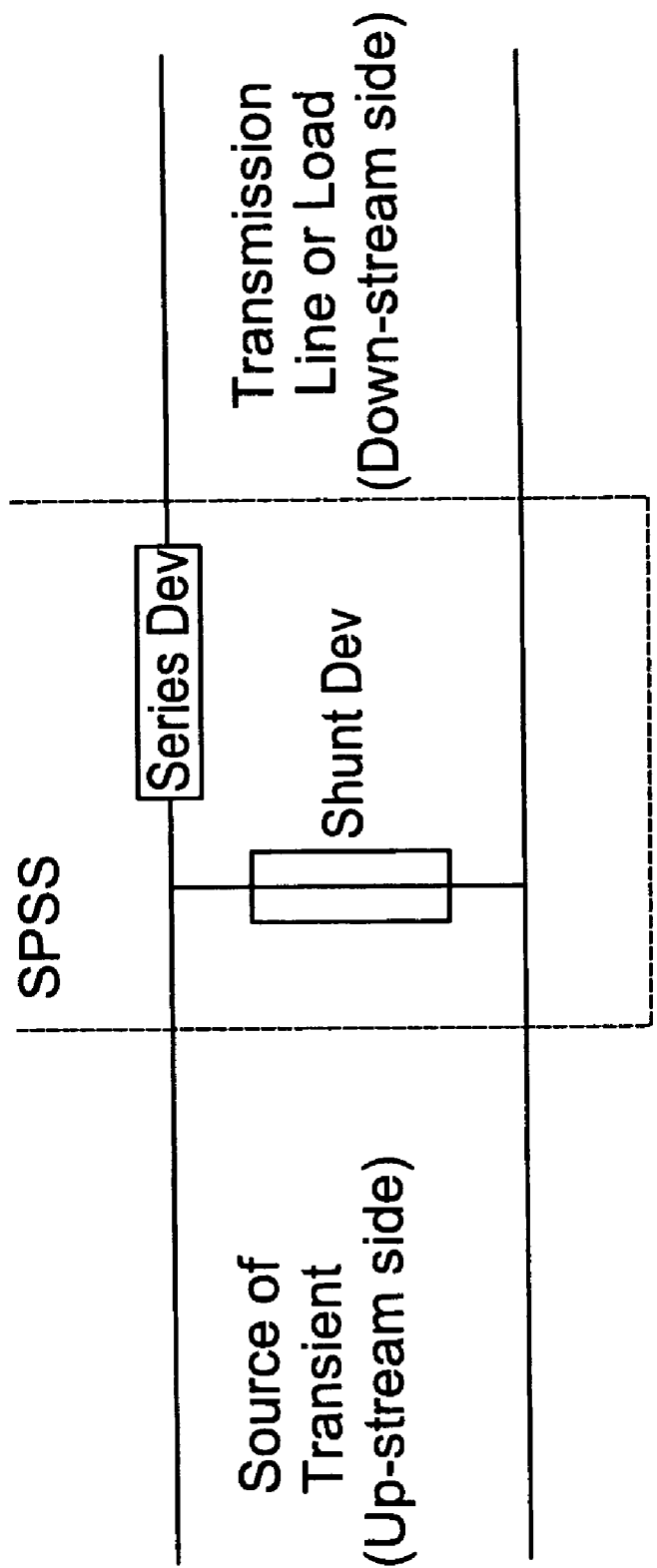
FIG. 24 shows a system, in which a transient blocking unit is used in combination with one or more shunt protection devices to build an improved shunt-series protection system (SSPS).

FIG. 24 shows a larger system, in which a transient blocking unit (e.g. according to any of FIGS. 5-23) is used in combination with one or more shunt protection devices (such as a varistor, gas tube, sidac, avalanche diode, or any other such device or combination thereof) to build an improved shunt-series protection system (SSPS). In this configuration the TBU (labelled "Series Dev") protects the downstream device from transient overcurrents, while the shunt device dissipates overvoltage surges. The unique characteristics of the TBU achieve increased safety in an SPSS configuration, and hence improved reliability in the entire electronic system.

The problems inherent in conventional shunt protection of co-ordination, component failure, surge waveshape dependence, complexity, and excessive shunt capacitance are well known and understood in data protection. The problems arise from the shortcomings inherent in shunt devices and the wide range of transient over-voltage threats that need to be dealt with in practice. Although with considerable engineering care, many of the problems can be engineered away under certain limited operating conditions, such effort comes at considerable expense and circuit complexity.

In many ways the gas arrester is close to the perfect shunt device available for communication system protection. It can handle the largest currents of any of the shunt protective devices (up to 20 kA and greater), and is reliable and inexpensive. The problem with the gas arrester is that it has a minimum theoretical firing voltage of about 75V and, relative to transients, it is slow to fire (operate). As a result, although they are able to handle the energy of most realistic transients, they cannot be used by themselves to protect systems.

Conventional protection techniques use subsequent stages of MOV, avalanche diode and sometime SIDAC components to clean up the let through voltages of the gas arrester. This is the premise of the 2 and 3 stage protection circuit and secondary protection system in telecommunication applications. However, these devices are liable to fail (due to their limited current handling capacity) and are the major cause of problems and outages in practical protection systems.

The key problem with both the MOV and avalanche diode, for example, is that they absorb energy during the transient. As a result, if the wave-shape of the transient is such that it defeats the co-ordination created by impedance between the primary and secondary protectors, problems will result.

It is widely accepted that, as surge phenomena are most commonly current based, blocking is an unsuitable protection method, due to the extremely high voltages generated. Therefore, the first stage of or step in protection in most circumstances must be based on shunt devices that divert the current to ground while maintaining manageable system voltages. However, after the primary protection element, surges are predominantly voltage based (down stream voltages from the primary arrester are generated by the shunting voltage of the primary arrester). As a result the use of series devices after the primary protector is practical, and in many circumstances sensible.

The concept of the shunt/series protection system (SSPS) is to include a series protection element immediately after the shunt device. The basic arrangement is for the shunt device to manage the voltages at the location of the protector and the series protector to manage the current passing by the point of protection.

The co-operative arrangement between the protective elements is essentially quite simple and highly complementary. The shunt device is constructed to manage the surge current in line with the current-source characteristic of most surges. This device diverts the transient away from the protected line. Naturally, the shunt devices will normally be open circuit moving to something resembling a short circuit during operation. The shunt device is triggered by excess line voltage.

The series device is a complementary component. It is constructed to ensure that current passing by the point of protection is less than that which can damage any downstream equipment. It would normally be a short circuit, changing to a high resistance to restrict current flow. The series device is triggered by excess line current.

The shunt device needs to be rated to manage the surge current. The series device needs to be rated to handle the voltages generated across the shunt device (during and after it fires) while limiting the down stream current to the maximum permitted.

Interestingly, the two devices as described inherently work co-operatively—they do not compete and so do not require classical "coordination". Take, for example, the case when the series device triggers due to excess line current. In limiting the flow of current the series device will at least partially open circuit the transmission line. This will have the effect of causing the voltage across the shunt device (immediately preceding the series device) to rise more quickly—driving the shunt device into. operation earlier then it would normally, ensuring the voltages on the line remain under control. This natural cooperation between shunt and series components means that rather than needing co-ordination, the shunt/series protector pair is inherently coordinated.

Further, multiple pairs of the shunt/series protector along a common transmission line (one of the greatest problems with conventional shunt only protection system) are also inherently co-ordinated. The only requirement is that the series device in the direction of the surge source must have a current trip rating less than the current carrying capacity of the next downstream shunt device -which is almost universally the case as the series device trip current is set to protect the equipment, while the shunt device current capacity is based on the likely transient current. As a result, if this requirement is complied with, then one can place any number of shunt/series pairs on a transmission line and have no problem with co-ordination. The first series device to trip will cause its paired shunt device to fire, this will cause any upstream series device to trip, causing its paired shunt devices to fire, until the surge is pushed out to the shunt/series pair closest to the generation or entrance point of the transient.

Fultec's Transient Blocking Unit (TBU) was designed to fill the role of the series device within the shunt/series protection arrangement of FIG. 24. As stated, during normal operation, the TBU is a low non-reactive resistance having minimal effect on the operation of the circuit. The TBU monitors the current flowing into the load. When that current reaches a preset maximum the TBU triggers to an effective open circuit with sufficient blocking capacity to withstand the let-through voltages of a shunt device.

The gas arrester is the best shunt device for use in the shunt/series circuit. The gas arrester can handle the current of a lightning strike or a power surge on a communications circuit, and the TBU can handle any of the voltages generated across the gas arrester before it fires (the gas arrester's main deficiency).

In fact, the gas arrester/TBU protection pair provides complete and effective protection for transients with rise times up to and in excess of 10 kV/$\mu$s (the most severe test standard of any specification) and of surge durations of any length short of that required to destroy the gas arrester (an extremely rare occurrence). This protection can simultaneously protect against power cross (AC and DC), power induction or power earth potential rise, as well as audio frequency induction, direct strike and earth potential rise lightning transients of virtually any practical duration. This is achieved in the simple two-component configuration. All without affecting circuit bandwidth.

In the case of power frequency cross or induction, if care is taken to ensure that a gas arrester with sufficiently high spark-over voltage is chosen so that it will not fire in the presence of the likely power frequency voltage, then gas arrester/TBU protection can survive an indefinite power frequency exposure without degradation.

The blocking voltage is the maximum voltage that the TBU is able to handle. Designers should attempt to use as low voltage TBU as possible, as the devices become more expensive with higher blocking voltage. A 500V TBU is best matched with a fast 230V gas arrester (with sparkover voltage of less than <500V for transient with fronts=<1000V/$\mu$s). In the case where an interface is at risk of exposure to direct lighting strike, a 175V (i.e. 240V 1 mA DC) varistor can be placed directly across the gas arrester. The varistor will categorically ensure that the peak voltage across the gas arrester never exceeds 500V even during extreme transients before the gas arrester fires. Alternatively, a hybrid arrester as marketed by companies such as Semitron, Epcos and Bourns, which have integrated avalanche diodes or MOV, can be deployed. There is little purpose in choosing a gas arrester with a spark-over voltage below 230V. 230V arresters have been optimized for use on telephone networks and have the fastest response and highest holding voltage. Meanwhile the TBU can block any transient voltages below 230V of any duration or waveshape.

If for circuit bandwidth reasons it is undesirable to place an MOV (varistor) across the gas arrester or use a hybrid arrester (due to the capacitance of the MOV or diode), then a higher voltage TBU can be used. As a guide the voltage across a fast 230V Epcos gas arrester will not exceed 800V in all but the most extreme cases (and certainly not for a 10 kV/$\mu$s rise time transient). The voltage across such an arrester will not exceed 1100V unless it has been physically damaged.

If the operation of the circuit or power cross voltage exposure requires the use of a higher voltage gas arrester, then a higher voltage TBU will be needed. Again, in the event of extreme exposure, consideration should be given to placing an MOV directly across the gas arrester to clip the peak of the let through voltage.

Figure 25:
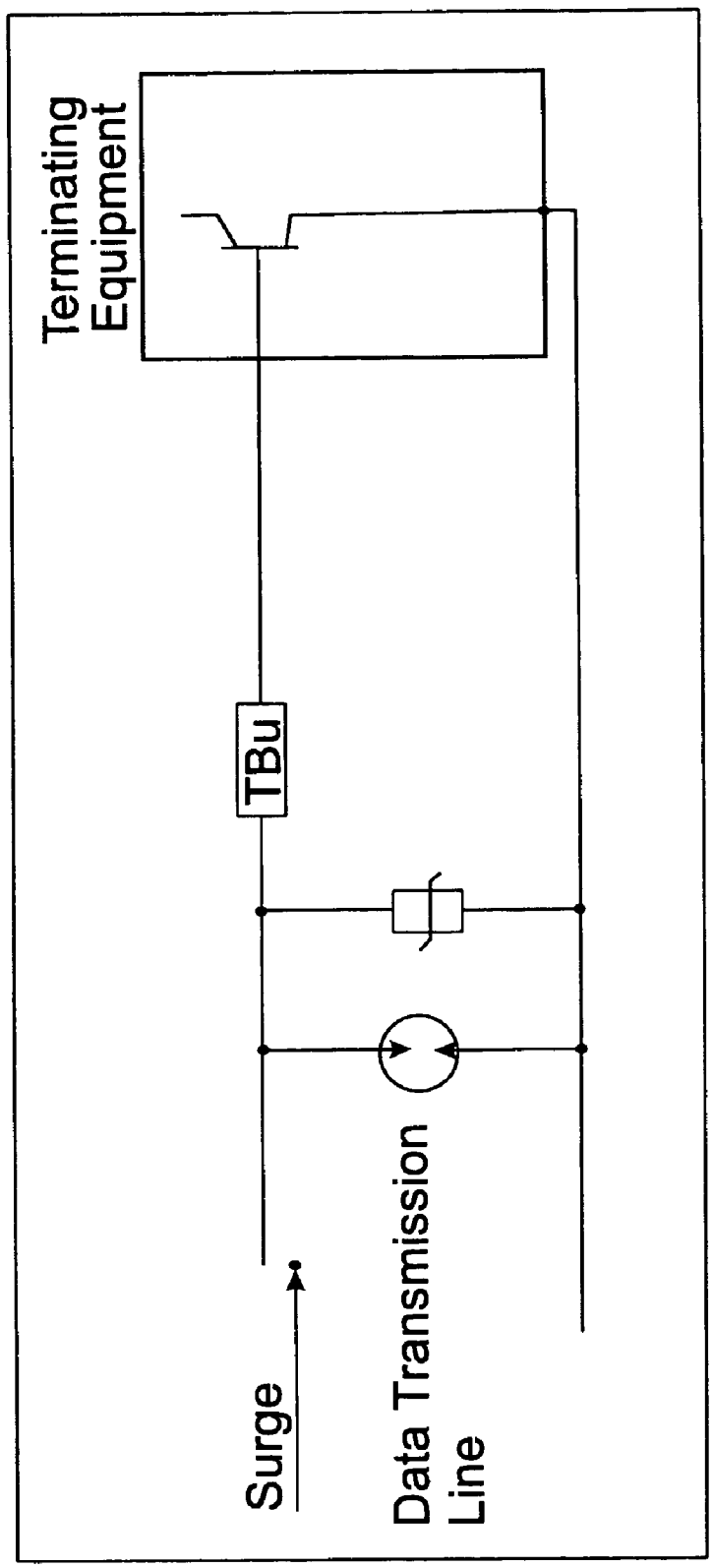
FIG. 25 shows a larger system, in which an improved telecomm system uses a transient blocking unit, in combination with shunt devices, to avoid damage due to transients on its data input lines.

FIG. 25 shows a larger system embodiment, in which an SPSS configuration, including a TBU series stage and a gas+diode shunt stage, are interposed between a data transmission line and the input to telecomm equipment.

Of course many variations of this design can be used for various systems. The skilled engineer, in undertaking the design process for such an implementation, should determine that the maximum permissible current in the interface before the TBU should react and disconnect. TBUs are available in increments of approximately 25 mA steps to 200 ma and with blocking voltages of 500V, 800V and 1100V (the blocking voltage is the maximum blocking voltage capability of the TBU).

The higher the blocking voltage the more expensive the TBU device. The 500V TBU is the best value in terms of cost. It should be matched with a fast 230V gas arrester or a SCR/SIDAC/SIBOD type semiconductor shunt device with a trigger voltage less than approximately 400V.

The combination of a fast GDT/TBU is able to withstand transients with rates of rise up to 2 kV/$\mu$second (this covers the vast majority of surges seen on normal office communications systems). If the interface is likely to be exposed to faster rising surges, a 175V (240V 1 mA voltage) varistor can be placed directly across the GDT (see FIG. 25). The varistor will ensure that the peak voltage across the GDT never exceeds 500V even during extreme transients—while the presence of the GDT will ensure that at no time can the energy rating of the MOV be exceeded.

Care should be taken to avoid using an MOV below 175V with a 230V gas arrester as the MOV may actually prevent the gas arrester firing on some transients—thus exposing the MOV to possible failure. For example, if the protection circuit is exposed to a power frequency overvoltage that causes the MOV to carry current without the gas arrester firing, then sufficient energy could be delivered to the MOV to damage it. If a typical 175V MOV with a 230V 1 mA voltage is used, then the maximum current the MOV can carry before the gas arrester fires in as little as a few 100's of microseconds is 1 mA—very much within its safe limits of operation. Alternatively, a hybrid arrester as marketed by companies such as Liftelfuse and Epcos, which have an integrated avalanche diode across the gas arrester, can be employed.

There is little purpose in choosing a shunt device with an operating voltage below 230V. 230V GDTs, for example, have been optimized for use on telephone networks and have the fastest response and highest holding voltage. Meanwhile the 500V TBU can safely block transient voltages below 230V of any duration or wave shape.

The TBU itself, and the various embodiments described above, is a new kind of device, whose operation is very different from normal power device structures. The device structures described above can be described in terms of response to applied voltage, and this analysis can be useful in understanding depletion and junction bias issues as described above; however, as the system configurations of FIGS. 24 and 25 show, the TBU preferably does not have any reference to ground. For such a floating device a current description can be more useful.

For example, one sample commercial configuration is specified to:

50 mA trip current (at 25 degrees C.);

50 ohms untripped resistance;

at least 60 kOhms tripped resistance;

500 V isolation (as tested by a 20 nsec waveform); and one microsecond max time to trip (as tested by a 20 nsec waveform).

One class of embodiments provides an integrated circuit surge protection apparatus arranged to limit a current flow between a first connection point and a second connection point, including: a body of a first type of semiconductor including a first channel for the flow of the current; and one or more regions of a second type of semiconductor material located in the body including a second channel for the flow of the current; and a portion disposed to increasingly deplete and pinch off the first channel in response to an increase in magnitude of a potential difference between a point in the first channel and a point in the second channel.

Another class of embodiments provides a transient-blocking device comprising: first, intermediate, and second active semiconductor devices, all jointly connected in series between an input terminal and an output terminal; wherein said first and second devices have corresponding structure, but are connected with opposite directions of current flow; said intermediate device being a back-gated depletion device.

Yet another class of embodiments provides a transient-blocking device comprising: first, intermediate, and second active semiconductor devices, all jointly connected in series between an input terminal and an output terminal; wherein said first and second devices are both vertical depletion-mode DMOS devices, but are connected so that one of them operates with inverted current flow; said intermediate device being a back-gated depletion field-effect device.

Yet another class of embodiments provides a transient-blocking device comprising: first and second vertical-current-flow power semiconductor devices, each having a control terminal and first and second current-carrying terminals; said control terminal of said first device being connected to said first current-carrying terminal of said second device, and said control terminal of said second device being connected to said first current-carrying terminal of said first device; said second current-carrying terminals for said first and second devices being separately connected to provide external power connections; and a voltage divider network which provides a voltage intermediate between the voltages of said second current-carrying terminals; and a lateral-current-flow active device which is connected to be gated by said intermediate voltage.

Yet another class of embodiments provides a transient blocking device, comprising: first and second transistors connected in series between a power input connection and a power output connection; said first and second transistors having opposite conductivity types; said second transistor being a vertical depletion-mode transistor which is gated by an extension of a body diffusion of said first transistor; whereby at least some voltage transients seen by said first transistor immediately turn off said second transistor.

Yet another class of embodiments provides a transient blocking device, comprising: a depletion-mode blocking transistor indirectly connected, in series with an impedance element between two power input/output connections; said blocking transistor being a vertical depletion-mode transistor which comprises at least one gate diffusion at the surface of an epitaxial layer, a first source/drain within said epitaxial layer, and a second source/drain within an additional semiconductor layer which overlies said epitaxial layer; wherein one or more of said impedance elements are electrically interposed between said gate diffusion and one of said power input/output connections, and also electrically interposed between one of said power input/output connections and one of said source/drains; whereby at least some voltage transients seen by said first transistor immediately turn off said second transistor, and said second transistor resumes conduction after said voltage transients disappear.

Yet another class of embodiments provides an SPSS protection circuit, comprising a shunt protection device in combination with a series-connect transient blocking device according to any of the preceding paragraphs.

Yet another class of embodiments provides an electronic system in which an SPSS protection circuit according to the preceding paragraph is interposed between at least one input/output terminal and a corresponding data transmission line. Yet another class of embodiments provides an electronic system in which an SPSS protection circuit according to the preceding paragraph is interposed between a power input terminal and a corresponding power supply connection. Yet another class of embodiments provides an electronic system in which an SPSS protection circuit according to the preceding paragraph is interposed between an electronic module's ground (earth) terminal and a corresponding ground (earth) connection.

Modifications and Variations

It will be realized that the specific integrated circuits described herein are merely preferred embodiments of the invention and that that many variations are possible. For example, in the embodiment depicted in FIG. 3 the vertical MOSFETs 13 and 15 have channels of a first type of semiconductor (i.e. N type) wherein the majority carriers are electrons. Conversely, the intermediate JFET channel is comprised of a second type of semiconductor wherein the majority carriers are holes. It will be realized that the type of semiconductor used for the MOSFETs and JFET might be reversed. For example, the integrated circuit of FIG. 5 might be built upon a P+ substrate in which case the resulting MOSFET channels would be of a P-type and the JFET channel would be of an N-type. Furthermore, as previously mentioned the invention may be adapted for UMOSFET, VMOSFET or other MOSFET or JFET designs and is not restricted to only DMOSFET arrangements.

It will be noted that a device according to an embodiment of the present invention differs to devices produced using typical prior art approaches to IC design. Prior art devices generally incorporate wholly separate transistor devices that are interconnected using a circuit wiring layer. In contrast, devices are described herein in which various P and N channel structures are integrated together in such a way that normally parasitic, non-desirable, junction effects may be used to advantage.

The embodiments of the invention described herein are provided for purposes of explaining the principles thereof, and are not to be considered as limiting or restricting the invention since many modifications may be made by the exercise of skill in the art without departing from the scope of the invention.

It should be noted that the term "MOSFET" is conventionally used to refer to a variety of insulated-gate field-effect transistor structures, and does not necessarily imply that the gate material must be a metal, nor that the gate insulation must be an oxide.

For power applications it is also possible to add a capacitor on the load side of the TBU, so that a short surge will not cause any error condition at the power supply (or reset of the electronics) in the equipment being protected.

As will be recognized by those skilled in the art, there are many alternative forms of field-effect and merged transistor structure. Thus various of the transistors described above can be modified by using semiconductor layers with different bandgaps, or conductors with different work functions, or implants to shape depletion boundaries.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC Section 112 unless the exact words "means for" are followed by a participle.

The claims as filed are intended to be as comprehensive as possible, and NO subject matter is intentionally relinquished, dedicated, or abandoned.

What is claimed is:

1. An integrated circuit surge protection apparatus arranged to limit a current flow between a first connection point and a second connection point, including:
    a body of a first type of semiconductor including a first channel for the flow of the current; and
    one or more regions of a second type of semiconductor material located in the body including
    a second channel for the flow of the current; and
    a portion disposed to pinch off the first channel in response to an increase in magnitude of a potential difference between a point in the first channel and a point in the second channel;
    whereby at least some voltage transients immediately pinch off said first channel, thereby substantially blocking electrical conduction in said first channel, and said first channel resumes conduction after said voltage transients disappear.

2. An apparatus according to claim 1 further including a first gate arranged to increasingly restrict flow of the current through the first channel in response to an increase in potential difference between a point in the first channel and a point in the second channel.

3. An apparatus according to claim 2, wherein the one or more regions of said second type of semiconductor include a third channel for the flow of the current.

4. An apparatus according to claim 3 further including a second gate arranged to increasingly restrict flow of the current through the third channel in response to an increase in potential difference between a point in the first channel and a point in the third channel.

5. An apparatus according to claim 4, wherein the body of a first type of semiconductor is composed of p-type semiconductor material and wherein the one or more regions of the second type of semiconductor material are composed of n-type semiconductor material.

6. An apparatus according to claim 4, wherein the body of the first type of semiconductor is composed of n-type semiconductor and wherein the one or more regions of the second type of semiconductor material are composed of p-type semiconductor material.

7. An apparatus according to claim 4, wherein the second and third channels and the first and second gates respectively comprise first and second MOSFETs.

8. A transient blocking device, comprising:
    a depletion-mode blocking transistor indirectly connected, in series with one or more impedance elements between two power input/output connections; said blocking transistor being a vertical depletion-mode transistor which comprises
    at least one gate diffusion at the surface of an epitaxial layer,
    a first source/drain within said epitaxial layer, and
    a second source/drain within an additional semiconductor layer which overlies said epitaxial layer;
    wherein one or more of said impedance elements are electrically interposed between said gate diffusion and one of said power input/output connections, and also electrically interposed between one of said power input/output connections and one of said of said source/drains;
    whereby at least some voltage transients seen by said one or more impedance elements immediately turn off said blocking transistor, thereby substantially blocking electrical conduction in said blocking transistor, and said blocking transistor resumes conduction after said voltage transients disappear.

9. The device of claim 8, wherein said vertical depletion-mode transistor is a JFET.

10. The device of claim 8, comprising two of said impedance elements, of which only one is a transistor.

11. The device of claim 8, comprising two of said impedance elements, each separately connected to a respective one of said gate diffusions.

12. The device of claim 8, wherein said epitaxial layer is N-type.

13. The device of claim 8, wherein said additional semiconductor layer is substantially monocrystalline.

14. The device of claim 8, wherein said additional semiconductor layer consists of a second epitaxial layer.

15. The device of claim 8, wherein at least one said impedance element is a depletion-mode transistor.

16. An SPSS protection circuit, comprising a shunt protection device in combination with a series-connect transient blocking device according to claim 1.

17. An electronic system, comprising at least one input/output terminal, and an SPSS protection circuit according to claim 16 interposed between said terminal and a data transmission line.

18. An electronic system, comprising at least one power input terminal, and an SPSS protection circuit according to claim 16 interposed between said terminal and a power supply connection.

19. An electronic system, comprising an SPSS protection circuit according to claim 16 interposed between a ground (earth) terminal of the electronic system and an external ground.

20. An SPSS protection circuit, comprising a shunt protection device in combination with a series-connected transient blocking device according to claim 18.

* * * * *